(12) United States Patent
Victorin

(10) Patent No.: US 12,136,810 B2
(45) Date of Patent: Nov. 5, 2024

(54) START-UP PROTECTION USING INRUSH CURRENT CONTROL

(71) Applicant: Thomas Victorin, Coconut Creek, FL (US)

(72) Inventor: Thomas Victorin, Coconut Creek, FL (US)

( * ) Notice: Subject to any disclaimer, the term of this patent is extended or adjusted under 35 U.S.C. 154(b) by 0 days.

(21) Appl. No.: 18/235,882

(22) Filed: Aug. 20, 2023

(65) Prior Publication Data

US 2024/0113516 A1    Apr. 4, 2024

Related U.S. Application Data

(60) Provisional application No. 63/412,859, filed on Oct. 3, 2022.

(51) Int. Cl.
| | | |
|---|---|---|
| *H02H 9/00* | (2006.01) | |
| *H02H 9/04* | (2006.01) | |
| *H03K 17/72* | (2006.01) | |

(52) U.S. Cl.
CPC .............. *H02H 9/001* (2013.01); *H02H 9/04* (2013.01); *H03K 17/72* (2013.01)

(58) Field of Classification Search
CPC .......... H03K 17/72; H02H 9/04; H02H 9/001; H02H 9/002
USPC ....................................................... 361/93.1
See application file for complete search history.

(56) References Cited

U.S. PATENT DOCUMENTS

| | | | |
|---|---|---|---|
| 7,088,078 B2 | 8/2006 | Liu | |
| 8,779,633 B2 * | 7/2014 | Hodges | H02H 3/12 |
| | | | 307/130 |
| 9,120,657 B1 | 10/2015 | Hua et al. | |
| 9,160,257 B2 * | 10/2015 | Hua | H02P 23/14 |
| 9,349,548 B2 | 5/2016 | Juricev | |
| 9,660,440 B2 | 5/2017 | Lagnoux et al. | |
| 9,954,432 B2 | 4/2018 | Kao | |
| 10,483,061 B2 | 11/2019 | Yokota et al. | |
| 10,685,767 B2 | 6/2020 | Kamensek et al. | |
| 11,128,934 B2 | 9/2021 | Thomas | |
| 11,394,198 B2 | 7/2022 | Hansen | |
| 2021/0273447 A1 | 9/2021 | Thomas | |
| 2021/0328390 A1 | 10/2021 | Hansen | |
| 2023/0070219 A1 | 3/2023 | Aboueldahab et al. | |

* cited by examiner

*Primary Examiner* — Kevin J Comber
(74) *Attorney, Agent, or Firm* — Isidore PLLC

(57) ABSTRACT

An inrush control apparatus (ICA) having power limiting circuitry controls inrush current demand at load startup. The ICA controller continuously evaluates load power consumption based on characteristics of loads electrically connected, via the ICA, to an alternating current (AC) source. In response to detecting an inrush current condition, the controller initiates one or more soft-start procedures that includes triggering a thyristor to provide duty-cycled power, using duty cycled parameters associated with characteristics of a particular load. The controller connects the triggered thyristor to the particular load and disconnects the AC source power from the particular load. The thyristor provides duty-cycled power supplying a specified power level to the particular load, corresponding to steady state operation of the particular load. In response to attaining steady state operation of the particular load, the controller completes the soft-start procedure by connecting the AC source power to the particular load and disengaging the thyristor.

18 Claims, 14 Drawing Sheets

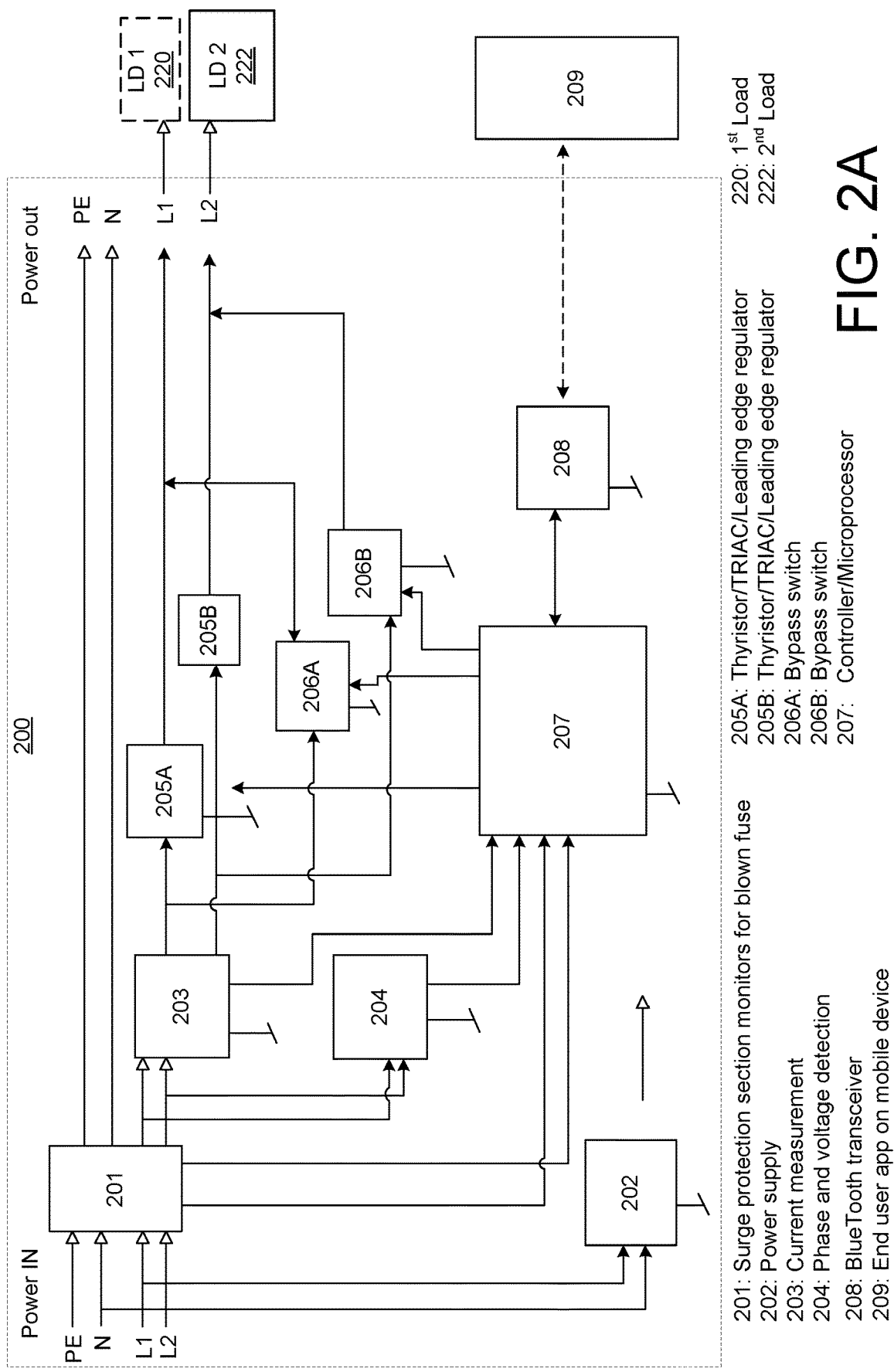

START-UP PROTECTION USING INRUSH CURRENT CONTROL

PRIORITY APPLICATION

The present application claims priority from U.S. Provisional Application No. 63/412,859, filed on Oct. 3, 2022. The entire content of that provisional application is fully incorporated herein.

TECHNICAL FIELD

The present disclosure relates generally to power supply management, and more particularly to power supply management during load start-up.

BACKGROUND

At startup, inductive loads, such as motors, compressors, and the like experience an inrush current. An inrush current condition arises due to the high initial currents required to charge the input capacitors and/or inductors of the load. The magnitude of the inrush current can be significant. Unless the source that is supplying power to the load is capable of instantaneously or nearly instantaneously supplying the full amount of the inrush current, the voltage of the AC power source will drop and will not recover until the inrush current has subsided and the load has begun to draw a relatively steady operating current. Other loads being supplied with power by the power source will be negatively affected by the voltage drop. For example, lights coupled to the power source may dim, fans may slow down, or there may be a complete brown out. In addition, electronic appliances configured to accommodate only small fluctuations in supply voltages may be damaged. In applications where the power source is a portable AC generator, or the like, uncontrolled inrush current can overload the generator and cause the generator to undergo an overload condition or cause an associated circuit breaker to trip or an associated fuse to fail. In other applications, where load is connected to a local power grid (e.g., a power grid for an RV park, home, or a marina) that has limited or poor power supply capability, uncontrolled inrush current at a single load may affect the entire grid and even cause a main breaker to trip.

SUMMARY

The present disclosure provides a method, a system, and a computer program product for controlling inrush current demand at device startup. An inrush control apparatus (ICA) configured with power monitoring and power limiting circuitry determines whether one or more loads are electrically connected to an alternating current (AC) source. In response to detecting connection of the one or more loads to the AC source, a controller of the ICA continuously evaluates load power consumption based on load characteristics. The controller determines, based on the evaluation of the load power consumption, whether an inrush current condition is detected. In response to detecting an inrush current condition, the controller uses a dual soft-starter to initiate one or more soft-start procedures that includes triggering a thyristor to provide duty-cycled power, using duty cycled parameters associated with characteristics of a particular load. In one or more embodiments, the controller detects/determines whether a single load or multiple loads are connected to respective hot wire lines of the apparatus. The controller initiates the soft-start procedure by selectively executing a corresponding one of: (i) multiple independent soft start procedures for loads running on a first "hot wire" line (L1) and a second "hot wire" line (L2), respectively; and (ii) a single soft start procedure for a load connected to at least one of (or both) the first and second hot wire lines. The controller connects the triggered thyristor to the particular load by switching off a relay to disconnect the AC source power from the particular load. As a result, the controller provides, via the thyristor, duty-cycled power supplying a specified power level to the particular load, the specified power level corresponding to steady state operation of the particular load. In response to attaining (or substantially approaching) steady state operation of the particular load, the controller completes a soft-start procedure by switching on (or activating) the relay to connect/reconnect the AC source power to the particular load and disengaging the thyristor.

According to one or more embodiments, the controller determines whether an inrush current condition is present based on sensed current and voltage characteristics of one or more individual hot wire lines. In response to detecting an inrush current condition, a controller of the ICA initiates a soft start procedure by activating a Thyristor or TRIAC (i.e., a triode for alternating current) connected to a hot wire line and switching off a relay that is connected in parallel with the Thyristor or TRIAC to prevent alternating current (AC) source power from being directly applied to the particular load. In response to activation, the Thyristor or TRIAC supplies power having a first power level to the load/device, according to a specified duty cycle. According to an aspect, the first power level is sufficiently large to enable devices/appliances that have been operating in a first state using a continuously supplied source power to remain operating within the first state using duty cycled power supplied by the Thyristor or TRIAC. The controller triggers the Thyristor or TRIAC to gradually increase power being supplied to the particular load from a first power level to a second power level required for a steady state operation of the particular load, in accordance with a specified ramp rate. In response to attaining the required second power level, the controller completes a soft start procedure by switching on the relay to enable source power to be directly applied to the particular load.

According to one or more embodiments, the ICA is configured to execute independent soft start procedures for loads running on a first "hot wire" line (L1) and a second "hot wire" line (L2), respectively. According to another aspect, the ICA is configured to execute a soft start procedure(s) for a particular load connected to both the first and second hot wire lines.

According to one or more embodiments, the controller sets an optimal power duty cycle, which causes the Thyristor or TRIAC, which is a component of a leading edge regulator to clip (or chop) the power waveform at a time instant within a selected time range that follows a start of the power cycle in order to provide the first power level. According to an implementation, the selected time range is the 100-300 msec range of the power cycle. According to an aspect, the first power level represents a first percentage of a steady state power of the AC power source.

According to another aspect, an inrush current control (ICC) application running on a mobile/portable device enables an operator to provide the optimal power duty cycle by setting a power level and a ramp rate that best suits the power supply demand profiles of the various loads/devices that can be connected to the ICA.

According to one or more embodiments, the controller executes the soft start procedure within a control period appropriately selected relative to a start-up time of the particular load. The selected control period enables a removal and/or sufficient reduction/mitigation of the inrush current condition. According to a related aspect, a sufficient reduction may correspond to a preset range of values based on a percentage reduction of peak power consumption.

According to one or more embodiments, the controller (i) triggers the Thyristor or TRIAC to clip (or chop) the power/current waveform to provide the required power level, (ii) closes the switch/relay to enable the power source to provide the steady state current required by the particular load, and (iii) disengages the Thyristor or TRIAC. According to an aspect, the required power level represents a second percentage of steady state power supplied by the AC power source.

According to one or more embodiments, the controller provides pulse width modulated (PWM) control signals to the gates of the Thyristor or TRIACS to trigger the Thyristor or TRIACS to supply regulated power/current to the particular load.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein. The appended drawings are provided to illustrate and not to limit the invention. Like reference numerals refer to like parts throughout the several views of the drawings, and in which:

FIG. 2A illustrates a block diagram representation of an example circuit used to implement the ICA, according to one or more embodiments;

DETAILED DESCRIPTION

Figure 1:
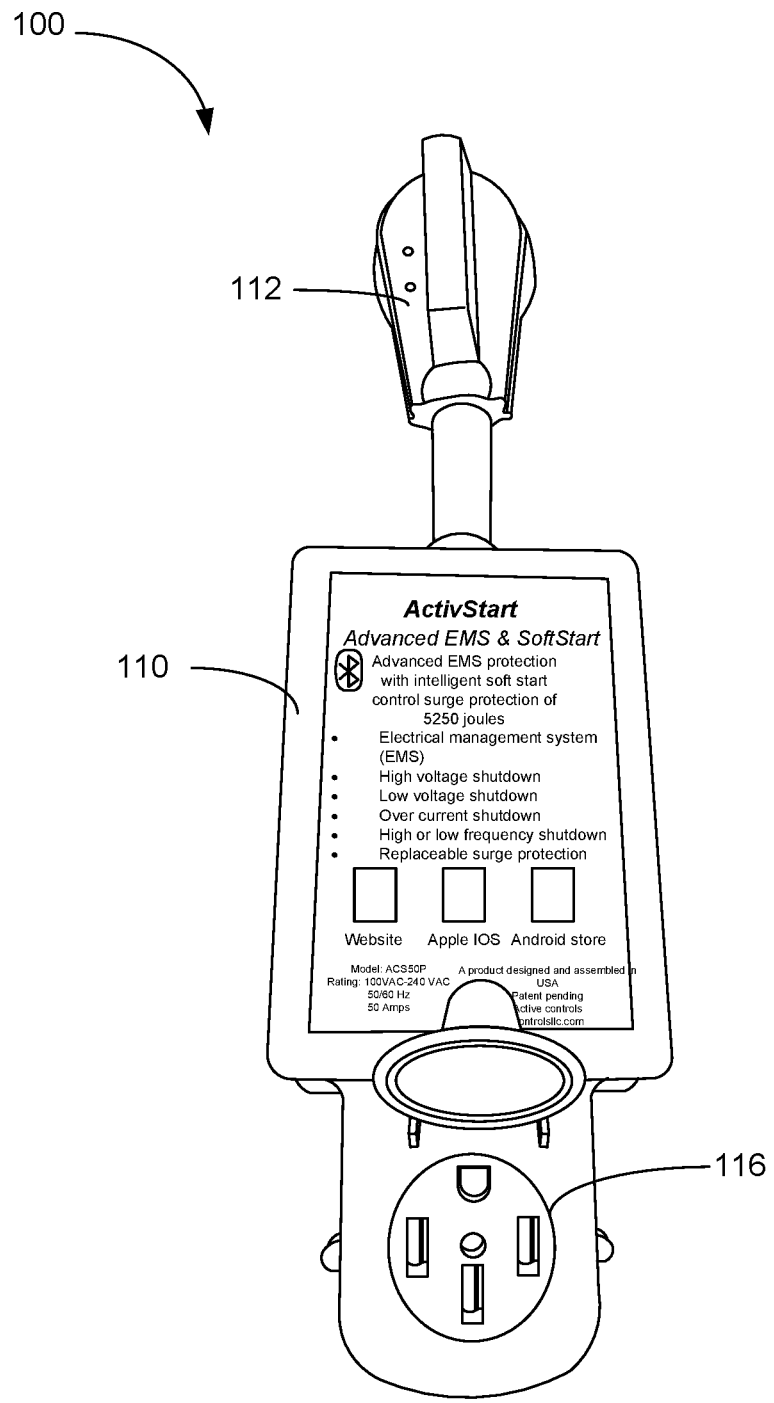
FIG. 1 illustrates an example of an inrush control apparatus (ICA), according to one or more embodiments.

The present disclosure provides an apparatus, a method, and a computer program product for controlling inrush current demand at device startup. According to one aspect, an inrush control apparatus (ICA) is configured with power monitoring and power limiting circuitry. The ICA determines whether a load is electrically connected to an alternating current (AC) source. In response to detecting connection of the load to the AC source, a controller of the ICA continuously evaluates load power consumption based on load characteristics. The controller determines, based on the evaluation of the load power consumption, whether an inrush current condition is detected. In response to detecting the inrush current condition, the controller initiates a soft-start procedure comprising triggering, using duty cycled parameters associated with characteristics of the load, a thyristor to provide duty-cycled power. In one or more embodiments, the controller detects/determines whether a single load or multiple loads are connected to respective hot wire lines of the apparatus. The controller initiates the soft-start procedure by selectively executing a corresponding one of: (i) multiple independent soft start procedures for loads running on a first "hot wire" line (L1) and a second "hot wire" line (L2), respectively; and (ii) a single soft start procedure for a load connected to at least one of (or both) the first and second hot wire lines. The controller disconnects the AC source power from the load and simultaneously connects the triggered thyristor to the load by switching off a relay connecting the AC source power. As a result, the controller provides, via the thyristor, duty-cycled power supplying a specified power level to the load, the specified power level corresponding to steady state operation of the load. In response to attaining steady state operation of the load, the controller completes the soft-start procedure by switching on (or activating) the relay to connect/reconnect the AC source power to the load and disengaging the thyristor.

The above introductory summary contains simplifications, generalizations and omissions of detail and is not intended as a comprehensive description of the claimed subject matter but, rather, is intended to provide a brief overview of some of the functionality associated therewith. Other systems, methods, functionality, features, and advantages of the claimed subject matter will be or will become apparent to one with skill in the art upon examination of the figures and the remaining detailed written description. The above as well as additional objectives, features, and advantages of the present disclosure will become apparent in the following detailed description.

Generally, the present disclosure is directed toward performing inrush current control using a soft-start procedure. "Soft starting" a load refers to an approach that involves controlling the inrush current to minimize or prevent a voltage drop. Conventional soft start devices require breaking an existing electrical connection and hard wiring the device between the power source and the load. In addition, these conventional soft start devices are not capable of detecting rapid instantaneous current increase that may be indicative of a new inrush current, e.g., when an appliance restarts or when an additional load is added.

One motivation for the present disclosure is the recognition that it would be extremely useful to be able to control/minimize inrush currents at device start-up without using a hard-wiring approach. The disclosure further recognizes that providing an apparatus that overcomes an inability to provide rapid instantaneous current sensing would be useful. Accordingly, according to a first aspect, the above introduced apparatus is provided, and includes functional components illustrated by FIG. 1, which is described below.

The following detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to make or use the embodiments of the disclosure and are not intended to limit the scope of the disclosure, which is defined by the claims. For purposes of description herein, the terms "upper", "lower", "left", "rear", "right", "front", "vertical", "horizontal", and derivatives thereof shall relate to the device orientation in FIG. 1. Furthermore, there is no intention to be bound by any expressed or implied theory presented in the preceding technical field, background, brief summary, or the following detailed description. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

In the following description, specific example embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized, and that logical, architectural, programmatic, mechanical, electrical, and other changes may be made without departing from the general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various aspects are described which may be aspects for some embodiments but not other embodiments.

The terminology used herein is for the purpose of describing particular embodiments only and is not intended to be limiting of the disclosure. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Moreover, the use of the terms first, second, etc. do not denote any order or importance, but rather the terms first, second, etc. are used to distinguish one element from another.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be provided its broadest interpretation given the context in which that term is utilized.

Those of ordinary skill in the art will appreciate that the hardware components and basic configuration depicted in the following figures may vary. For example, the illustrative components within ICA 100 (FIG. 1) are not intended to be exhaustive, but rather are representative to highlight components that can be utilized to implement the present disclosure. For example, other devices/components may be used in addition to, or in place of, the hardware depicted. The depicted example is not meant to imply architectural or other limitations with respect to the presently described embodiments and/or the general disclosure.

Within the descriptions of the different views of the figures, the use of the same reference numerals and/or symbols in different drawings indicates similar or identical items, and similar elements can be provided similar names and reference numerals throughout the figure(s). The specific identifiers/names and reference numerals assigned to the elements are provided solely to aid in the description and are not meant to imply any limitations (structural, functional, or otherwise) on the described embodiments.

With reference now to the figures, and beginning with FIG. 1, there is depicted an example of an inrush control apparatus (ICA), according to one or more embodiments. The ICA 100 comprises a housing 10 that contains electronics and processing/controller circuitry, which is described in greater detail in FIGS. 2A-2B. In addition, the ICA 100 comprises male and female connectors 112, 116, respectively, at opposed ends. The male and female connectors 112 and 116 are electrically connected to electronic/controller circuitry (see FIG. 2) housed within housing 110 of ICA 100. The male connector 112 may be a standard three prong (i.e., line, neutral, and earth ground) inline plug for plugging into a power outlet, e.g., a 120/240 VAC household outlet or receptacle. Alternatively, the male connector 112 can be a standard 4 prong plug consisting of a first hot wire line "L1", a second hot wire line "L2", Neutral and Earth Ground (PE). The female connector 116 may be a standard three prong inline receptacle for receiving a male plug of a load. Alternatively, the female connector 116 can be a standard 4 prong receptacle consisting of L1, L2, Neutral, and Earth Ground (PE). The male connector 112 is interchangeably referred to herein as a male plug 112, while the female connector 116 is interchangeably referred to as a female receptacle 116.

In an example application of the ICA 100, an AC power outlet into which the male connector 112 is inserted may supply power provided by a generator and the female connector 116 may receive a male plug from an air conditioning unit. Preferably, the housing 110 is a weatherproof National Electrical Manufacturers Association (NEMA) and/or Underwriters Laboratories (UL) compliant enclosure having openings at each end for receiving, via weatherproof fittings, the wiring to the electronic circuitry from the male plug 112 and the female receptacle 116, respectively. Light-Emitting Diodes (LEDs) located on the male plug 112 and female receptacle 116 may provide indications of the power quality of the incoming power (received via male plug 112) and whether there is power at the female receptable 116.

According to one or more aspects, the ICA 100 is configured for use in various types of environments. For example, the ICA 100 can be used to mitigate inrush current conditions in marine environments, residential environments, recreational vehicle (RV) environments, etc.

FIG. 2A illustrates a block diagram representation of an example active start circuit 200 used to implement the ICA, according to one or more embodiments. The circuit 200 shows the operation of two (2) soft-start devices that can operate in parallel or individually. The circuit 200 is capable of operating on 115 VAC only or on 240 VAC, with individual switches/relays used for engaging/disengaging power supplied via supply lines to the soft-start devices, respectively. Furthermore, the circuit 200 is configured for implementing the soft start module described herein. AC power received via the male plug 12 (FIG. 1) is supplied to a surge protection device/module 201 that essentially functions as a standard surge protector. A "hot" wire line (e.g., L1) and the neutral line (N) from the male plug 12 supply AC power to a DC power supply 202 which, in turn, supplies DC voltage (not shown) to activate/operate the various electronic components within the circuit 200.

Power to the inline female receptacle 16 (FIG. 1) and hence to the load (not shown) is supplied at the "power outlet" side of surge protection device 201, as illustrated. A more detailed view and description of the AC power connection to the surge protection device 201 is provided in FIG. 4. Detected surge conditions are also provided to controller (or microprocessor) 207, which includes a processor and a memory with relevant programmable code.

The circuitry 200 further includes a current measuring component 203, and a phase and voltage detection component 204. Components 203 and 204 supply data to controller 207 such that the controller 207 may detect when there is either an instantaneous increase in load current or a voltage drop and may then open bypass switch(es) 206A and/or 206B and activate the thyristors/TRIACs 205A and/or 205B (generally referred to as regulator(s)) to control the inrush current. According to one or more aspects, the soft-start devices comprise first thyristors/TRIACs 205A and second thyristors/TRIACs 205B, respectively. The soft-start devices collectively constitute a dual soft-starter capable of being applied to two different loads.

Bypass switch 206A and/or bypass switch 206B, each of which comprises a relay, are closed when there is no inrush current, i.e., when the load has begun to draw a relatively steady operating current. It will be appreciated that when bypass switch 206A and/or 206B is closed, leading edge regulator 205A and/or 205B, each of which comprises a TRIAC or thyristor, is bypassed and current is supplied from the power inlet to the power outlet via the bypass switch 206A and/or 206B, respectively. When the bypass switch 206A and/or bypass switch 206B is open, current is supplied via the respective/corresponding regulator/thyristor/TRIAC 205A and/or 205B under control of pulse width modulated signals supplied to the gates of the corresponding TRIAC(s)/thyristor(s), respectively, by controller 207, so as to regulate the current supplied to the load(s). As shown, each hot wire line is connected to a different thyristor. Each of the single thyristors is in turn connectable to a same load or a separate load from another thyristor connected to another hot wire line. Thus, during operation, in response to detecting the inrush current condition the controller: determines whether a single load or multiple loads are connected to respective hot wire lines of the apparatus; and executes a corresponding one of: (i) multiple independent soft start procedures for different loads running on a first "hot wire" line (L1) and a second "hot wire" line (L2), respectively; and (ii) a single soft start procedure for a single load connected to both the first and second hot wire lines. FIG. 2A presents a first load 220 and a second load 222, each receiving electrical power from a different thyristor-connected hot wire line. With this configuration, the apparatus provides multiple soft-start capabilities to enable power characteristics and start up and steady state needs for two different loads to be independently analyzed and independently configured. One or more embodiments support the addition of a new load (e.g., 220, indicated using dashed lines) to an existing load (e.g., 222, indicated with solid lines) on any one of the hot wire lines, as described further herein. Each of the two loads 220, 222 can be similar loads or have very different load characteristics and power requirements.

According to one or more aspects, a Bluetooth transceiver 208 may be provided for communicating with a smart mobile device 209 equipped with an App (e.g., an inrush current control (ICC) application) for displaying historical event data, current operating conditions, error conditions, etc. According to one or more aspects, an inrush current control (ICC) application running on a mobile/portable device enables an operator to provide the optimal power duty cycle by setting a power level and a ramp rate that best suits the power supply demand profiles of the various loads (e.g., connected devices and/or appliances).

According to one or more aspects, the controller 207 sets an optimal power duty cycle causing the TRIAC (or regulator) to clip (or chop) the power waveform at a time instant within a selected time range that follows a start of the power cycle to provide the first power level. According to an implementation, the selected time range is the 100-300 msec range of the power cycle.

According to one or more aspects, the controller 207 executes the soft start procedure within a control period appropriately selected relative to a start-up time of the load. The selected control period enables a removal and/or sufficient reduction/mitigation of the inrush current condition. According to a related aspect, a sufficient reduction may correspond to a preset range of values based on a percentage reduction of peak power consumption.

According to one or more aspects, the controller 207 triggers the TRIAC to clip (or chop) the power/current waveform to provide the required power level, and, to complete the soft-start procedure, closes the switch/relay to enable the power source to provide the steady state current required by the load/motor, and disengages the TRIAC.

According to one or more aspects, in embodiments that incorporates multiple TRIACs, the controller 207 provides pulse width modulated (PWM) control signals to the gates of each of the TRIACs to trigger the TRIACs to supply a specific regulated power/current to the load.

According to one or more embodiments, the ICA is configured to execute independent soft start procedures for loads running on a first "hot wire" line (L1) and a second "hot wire" line (L2), respectively. According to another aspect, the ICA is configured to execute a soft start procedure for a load connected to both the first and second hot wire lines (e.g., second load 222 receiving power from both L1 and L2).

According to one or more embodiments, the ICA is configured to execute multiple independent soft start procedures using respective soft-start circuit modules, which collectively constitute a dual soft-starter configured for operation using supply voltages that are either in-phase or out-of-phase. For example, during in-phase operation, the ICA enables each of a first load (220) connected to a first soft-start circuit module and a second load (222) coupled to a second soft-start circuit module to operate on 115 VAC single phase power. However, during out-of-phase operation using 230 VAC power, the ICA enables a first load coupled to a first soft-start circuit module to be powered using a first supply of 115 VAC and a second load coupled to a second soft-start circuit module to operate using a second supply of 115 VAC. In this out-of-phase operation, the first supply provides power that is out-of-phase with power provided by the second supply to respective loads (220, 222). Alternatively, during the out of phase operation, a combined supply of 230 VAC power (i.e., combining both L1 and L2) can be used to power a single load (e.g., LD2 222).

Thus, during in-phase operation, the first load 220 operates using a first "hot wire" line (L1) and the second load 222 operates on a second "hot wire" line (L1), "L1" and "L1" indicating that the hot wire lines are obtained from respective sections of a power source or from respective power sources, which sections/sources are relatively oriented/arranged to provide in phase power. During out-of-phase operation, the first load 220 operates using a first "hot wire" line (L1) and the second load 222 operates on a second "hot wire" line (L2), "L1" and "L2" indicating that the hot wire lines are obtained from respective sections of a power source or from respective power sources, which sections/sources are relatively oriented/arranged to provide out-of-phase power.

A dual soft-starter device, as described herein, provides significant benefits when the dual soft-starter device is utilized to modulate input power being applied to generators and RV park environments with inductive loads that require power. With generators and RV parks that have only a single 30 amp 115 VAC source, the ICA can be used with an RV dog bone power adapter that splits the single power available into two power lines to power an RV equipped with a power cord that supports two hot wire lines. In this arrangement, the RV dog bone is able to support an ICA that is configured to execute multiple independent soft start procedures via respective soft-start circuit modules using in-phase supply voltages.

According to one or more aspects, in response to use of the ICA to power a single load connected to a single one of the first hot wire line and the second hot wire line, the ICA provides a steady state power of a first power level. In response to use of the ICA to power two separate loads, each connected on one of the first and the second hot wire lines, respectively, the ICA channels a first voltage level to each of the first hot wire line and the second hot wire line to separately power respective first and second loads. In response to use of the ICA to power a single load requiring a larger voltage than the first voltage level, the ICA: receives input power at the first voltage level on the first hot wire line; receives input power at the first voltage level out-of-phase with the first phase on the second hot wire line; and provides a combined voltage level of a multiple greater than 1 of the first voltage level to the single load.

Figure 2B:
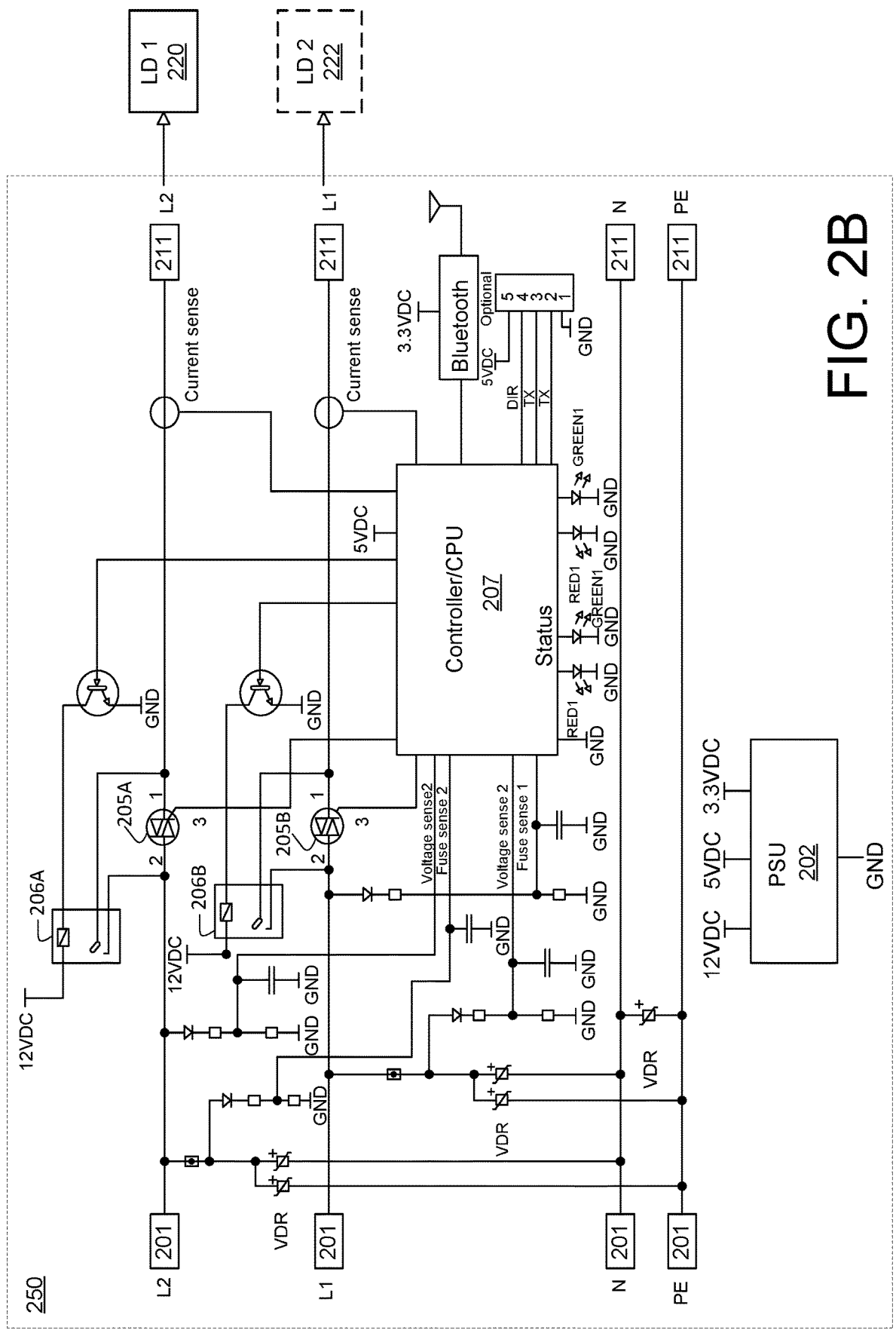
FIG. 2B illustrates a circuit diagram representation of another example circuit used to implement the ICA, according to one or more embodiments.

FIG. 2B illustrates a circuit diagram representation of another example circuit used to implement the ICA, according to one or more embodiments. The circuit diagram 250 provides a more detailed illustration of an example ICA circuit implementation compared with a level of detail provided by the circuit 200 which shows a corresponding ICA circuit implementation. As illustrated, circuit 250 comprises a number of components which are similar or identical to components shown circuit 200. For example, similar to circuit 200, circuit 250 comprises a central processing unit (CPU) operating as a controller 207, a surge protection circuit module, one or more bypass switches, a thyristor(s), such as a TRIAC(s), a power supply unit (PSU) 202. In addition, connector lines are shown for both the connections to AC power and to the load(s), respectively.

Figure 3:
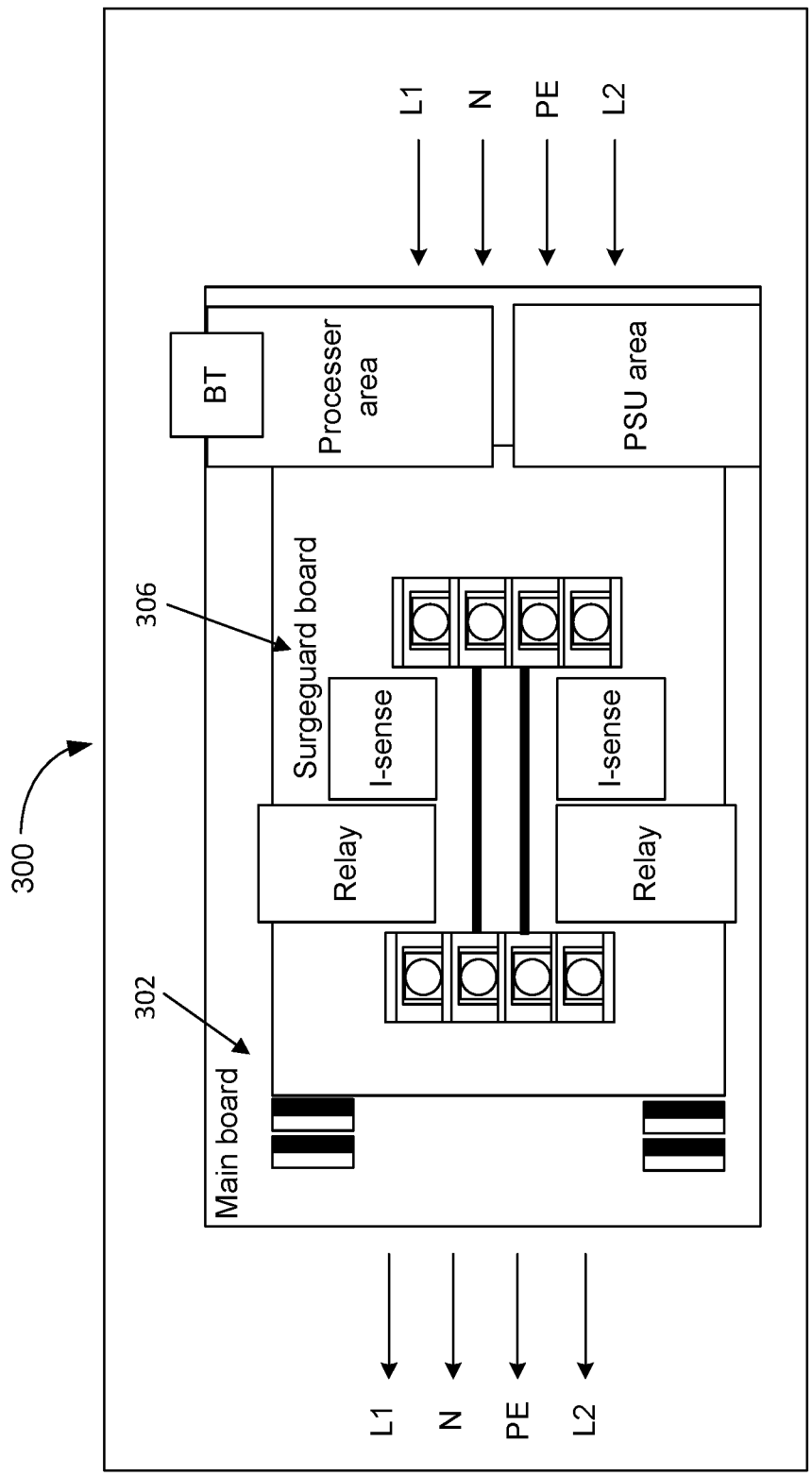
FIG. 3 illustrates an example implementation of the design of the ICA using a two-board stacked-up design that includes a soft-start component board connected to a surge protection component board, according to one or more embodiments.

FIG. 3 illustrates an example implementation of the design of the ICA using a two-board stacked-up design that includes a soft-start component board removably connected to a surge protection component board, according to one or more embodiments. The ICA design 300 comprises a first (main) board 302 containing all main soft-start components and a second (top) board 306 that contains the surge protection components. The main board 302 and the top board 306 collectively provide a stacked-up design implementation comprising boards that are removably interconnected by respective electrical connectors. The surge protection components are further described in the description of FIG. 4.

Figure 4:
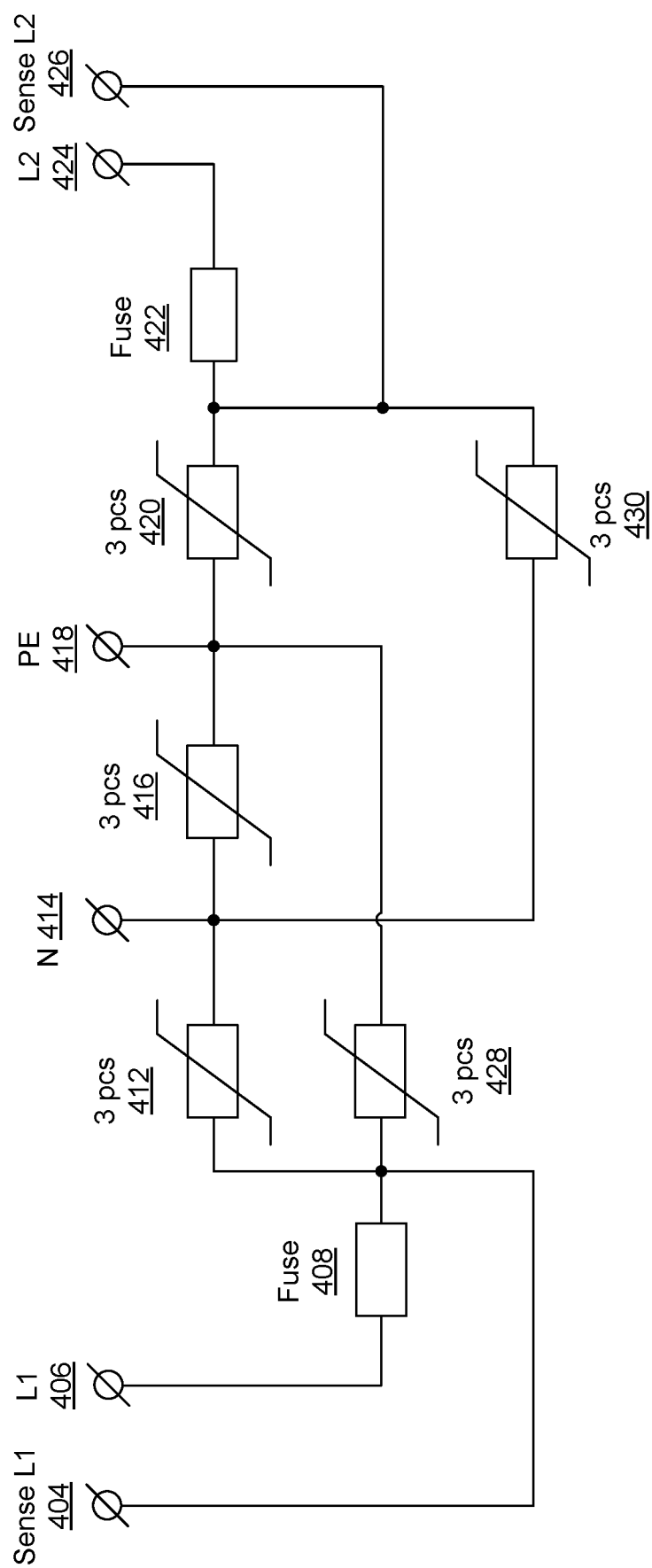
FIG. 4 illustrates a block diagram representation of an example circuit used to implement a surge protection module, according to one or more embodiments.

FIG. 4 illustrates a block diagram representation of an example circuit used to implement a surge protection module, such as the top board of FIG. 3, according to one or more embodiments. The surge protection module 400 comprises a number of surge protection components including components 412 and components 428. According to an implementation, each of components 412 and components 428 represents a combination of three (3) separate surge protection components arranged in parallel. A surge protection component protects the load from voltage and/or current surges and can be utilized to provide an indication (e.g., on a display device associated with the controller 207 or other visible indicator) of the occurrence thereof. Information regarding occurrences of a current surge or a voltage surge are provided/forwarded to the controller 207.

According to one or more aspects, the surge protection components include voltage suppression components that are rated to absorb a specified amount of energy and can be damaged if the specified amount of energy is exceeded. According to an aspect, a fuse is connected to one or more voltage suppression components 416, which are coupled to one or more of a Neutral line 414 and a Ground line 418, respectively.

Components 412 and components 428 are respectively connected to first hot wire line L1 406 via first fuse 408 having a specified power rating. The surge protection module 400 shows "sense L1" 404, which represents a first sensing operation that measures a voltage across the first fuse 408 in order to determine whether current is flowing through L1 406. If the controller detects, via sense L1 404, that there is no current flowing through L1 406, the controller 207 is able to determine that the first fuse 408 is blown. The controller is further able to determine that the surge protection components 412 and 428 no longer provide protection against power surges to the ICA 100. This lack of surge protection status information can be communicated to the app executing on a connected mobile device.

The surge protection components further include components 420 and components 430. According to an implementation, each of components 420 and components 430 represents a combination of three (3) surge protection components arranged in parallel. Components 420 and components 430 are respectively connected to second hot wire line L2 424 via second fuse 422 having a specified power rating. The surge protection module 400 shows "sense L2" 426, which represents a second sensing operation that measures a voltage across the second fuse 422 in order to determine whether current is flowing through L2 424. If the controller detects, via sense L2 426, that there is no current flowing through L2 424, the controller is able to determine that the second fuse 422 is blown. The controller 207 is further able to determine that the surge protection components 420 and 430 no longer provide protection against power surges to the ICA 100. This lack of surge protection status information can be communicated to the app executing on a connected mobile device.

According to one or more embodiments, a different indicator, such as an LED, can be used instead of a check of the physical fuse(s) to determine whether current is flowing on one or more lines including the one or more hot wire lines. According to an implementation, the surge protection components comprise fifteen (15) individual component pieces, which collectively provide approximately 5.25 Kilojoules of energy protection.

According to one or more embodiments, the soft-start module 714 (FIG. 7) includes monitoring components that monitor voltage, current, and frequency of the source power being received by the ICA 100.

According to one or more embodiments, the controller determines whether there is current through on one or more hot wire lines when the one or more hot wire lines are connected to a number of the specifically-rated fuses of the surge protection board/circuitry 1 (FIGS. 2A and 3). According to a related aspect, each fuse is connected to one or more sets of surge protection components (e.g., first and second sets of surge protection components) coupled to the Neutral line and/or the Ground line, respectively. According to one or more embodiments, the controller determines whether there is current flowing through the specifically rated fuse connected to the hot wire line.

According to one or more embodiments, the surge protection module/board is removably connected in parallel with the soft-start module/board. According to one embodiment, the surge protection module/board 1 is removably connected to the power connector lines, which include the one or more hot wire lines. As a result, a number of specifically rated fuses of the surge protection module/board 1 are removably connected to the one or more hot wire lines. According to one or more embodiments, the soft-start module is fixedly connected to the power connector lines.

According to one or more embodiments, the controller 207 receives information about current flow through the specifically rated fuse and determines a status/level of current flow through the surge protection components, based on the received information. If the controller 207 receives information indicating that there is no current flowing through the fuse, the controller is configured to perform an assessment that can enable the controller 207 to determine that the fuse is blown and that the surge protection components are also blown based on the lack of current flow detected.

According to another embodiment, the controller 207 determines that current does not flow through the fuse, and in response to not detecting current flow through the fuse, identifies that a surge voltage and/or surge currents, which results in a blown fuse, is a potential or likely cause of the lack of current flow. The controller 207 further identifies blown surge protection components as a potential or likely result of surge current. The controller 207 provides an indication/notification that the surge protection components and/or board should be replaced, based on identifying that the lack of current flow is potentially or likely a result that can be associated with blown surge protection components. According to one or more embodiments, based on the detected current flow, the controller 207 provides an indication/notification of the status of the surge protection module or board as one of an OK status (i.e., functioning module/board) and a NOT OK status (i.e., damaged module/board).

According to one or more embodiments, the soft-start module, which includes the controller 207 and the monitoring components, operates independently of the surge protection module. The ICA 100 is configured to provide continuous operation of the soft-start module even if one or more fuses and/or one or more surge protection components of the surge protection circuitry are blown and/or if there is a lack of current flow through one or more fuses connected to one or more of the hot wire lines.

Figure 5:
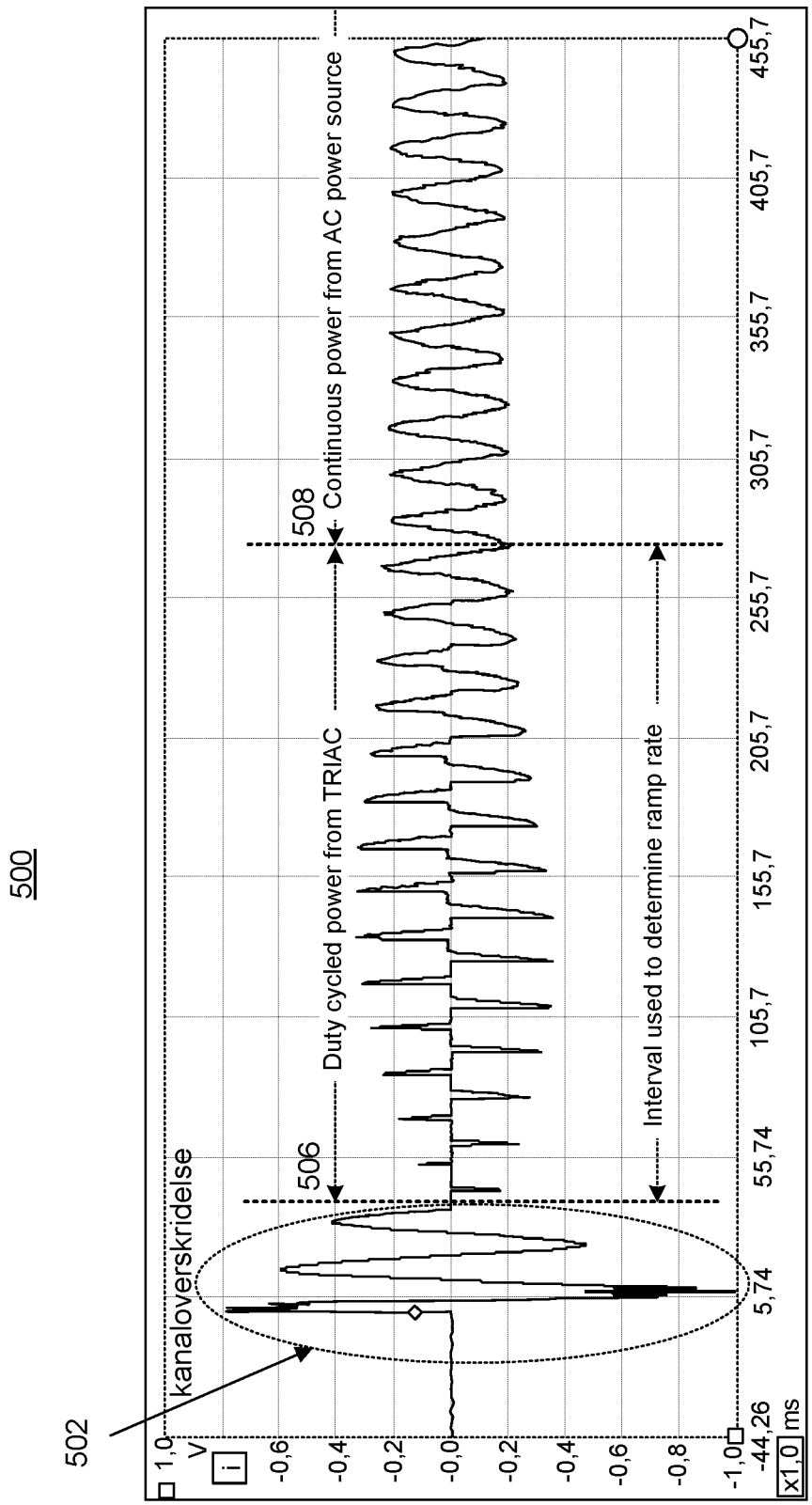
FIG. 5 illustrates a first waveform showing power consumption from start-up to steady state operation based on a specified ramp rate, according to one or more embodiments.
Figure 6:
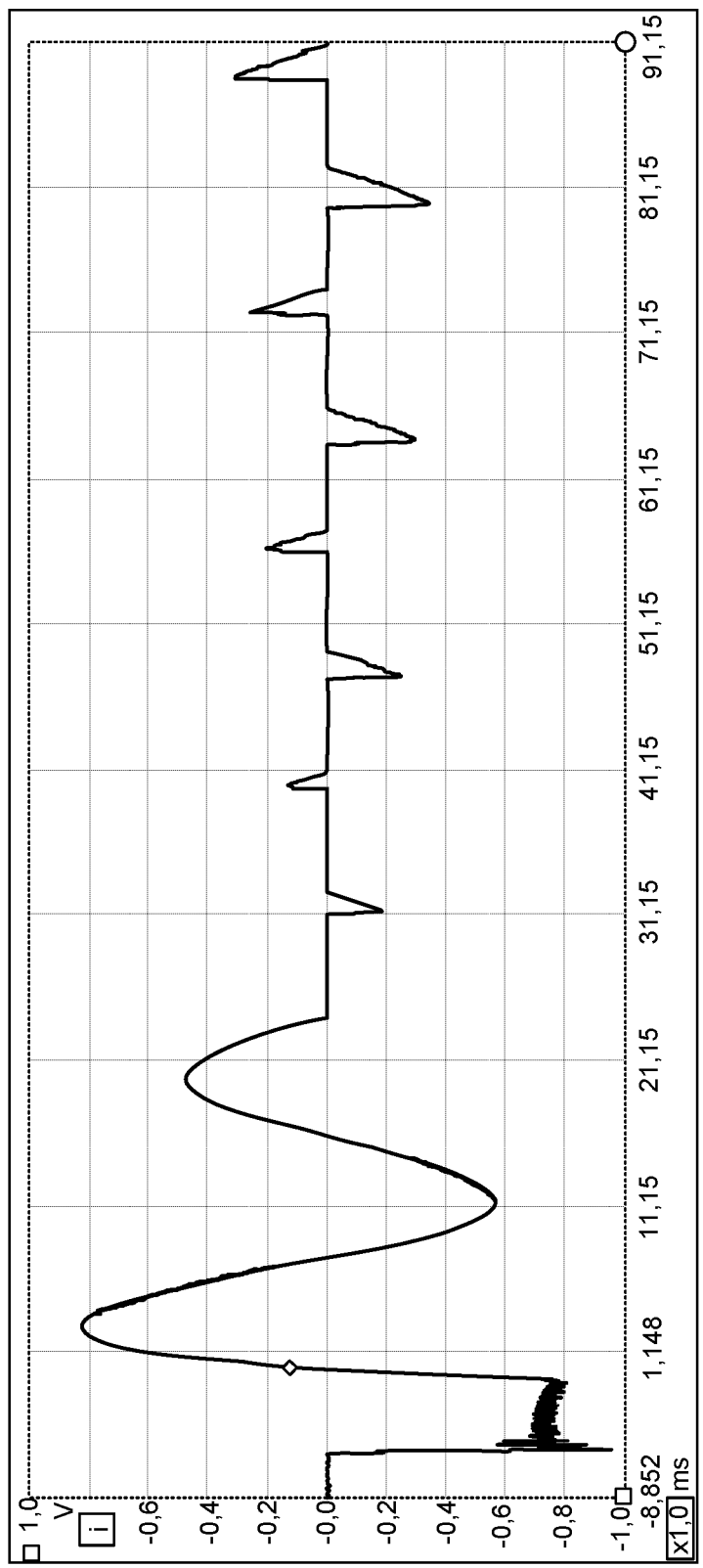
FIG. 6 illustrates a second waveform showing a more detailed view of power consumption using continuous source power and power consumption using duty-cycled power following start-up, according to one or more embodiments.

FIG. 5 illustrates a first waveform 500 showing power consumption from start-up to steady state operation of a connected load based on a specified ramp rate, according to one or more embodiments. First waveform 500 comprises a first region 502, which shows power consumption immediately following start-up of an inductive load. In particular, the first region 502 includes a high instantaneous voltage spike within a first cycle of power supplied to the load from the AC power source. As illustrated, the first region 502 further includes multiple other cycles of source power consumed by the inductive load. FIG. 6 illustrates a second waveform 600 showing a more detailed view of power consumption using continuous source power and power consumption using duty-cycled power following start-up, according to one or more embodiments.

According to one or more aspects, the controller 207 uses sensed current/voltage information to determine whether an inrush current condition exists. According to one or more related aspects, following startup of a load/device, such as a motor or compressor, the controller 207 is configured to determine, based on the detected high instantaneous power/current consumption, that an inrush current condition exists, where the inrush current condition is indicative of an inductive load being started. The inrush current condition is detected as a result of an above-threshold high instantaneous power consumption level. According to one or more embodiments, the controller 207 detects the inrush current condition after at least one cycle (e.g., two cycles), at which point, the controller 207 engages the TRIAC (or regulator), which supplies power to the load as the switch or relay that connects the AC power source directly to the load is opened. The controller 207 triggers the TRIAC to supply duty cycled power to the load. As illustrated in the example provided by first waveform 500 (FIG. 5), the load receives duty cycled power for a period of time following a short time interval corresponding to the first region 502. As shown by the example provided by first waveform 500, duty-cycled power provided by the TRIAC(s) begins at time marker 506. As illustrated, steady state operation utilizing power from the AC power source begins at time marker 508.

According to one or more embodiments, the controller 207 sets an optimal power duty cycle causing the TRIAC to clip or chop the power waveform at a time instant within a selected time range that follows a start of the power cycle, in order to provide the first power level. According to an implementation, the selected time range is the 100-300 msec range of the power cycle.

According to an aspect, an inrush demand control (IDC) application running on a mobile/portable device enables an operator to provide the optimal power duty cycle by setting a power level and a ramp rate that best suits the power supply demand profiles of the various loads/appliances. These settings are communicated to the controller via near field communication protocol, such as Bluetooth, or via a network to which the controller is communicatively coupled.

According to one or more embodiments, the controller executes the soft start procedure within a control period appropriately selected relative to a start-up time of the load. The selected control period enables a removal and/or sufficient reduction of the inrush current demand condition. According to a related aspect, a sufficient reduction may correspond to a preset range of values based on a percentage reduction of peak power consumption.

According to one or more embodiments, the controller triggers the TRIAC to clip/chop the power/current waveform to provide the required power level. The controller further closes the switch/relay to enable the power source to provide the steady state current required by the load/motor and disengages the TRIAC.

Figure 7:
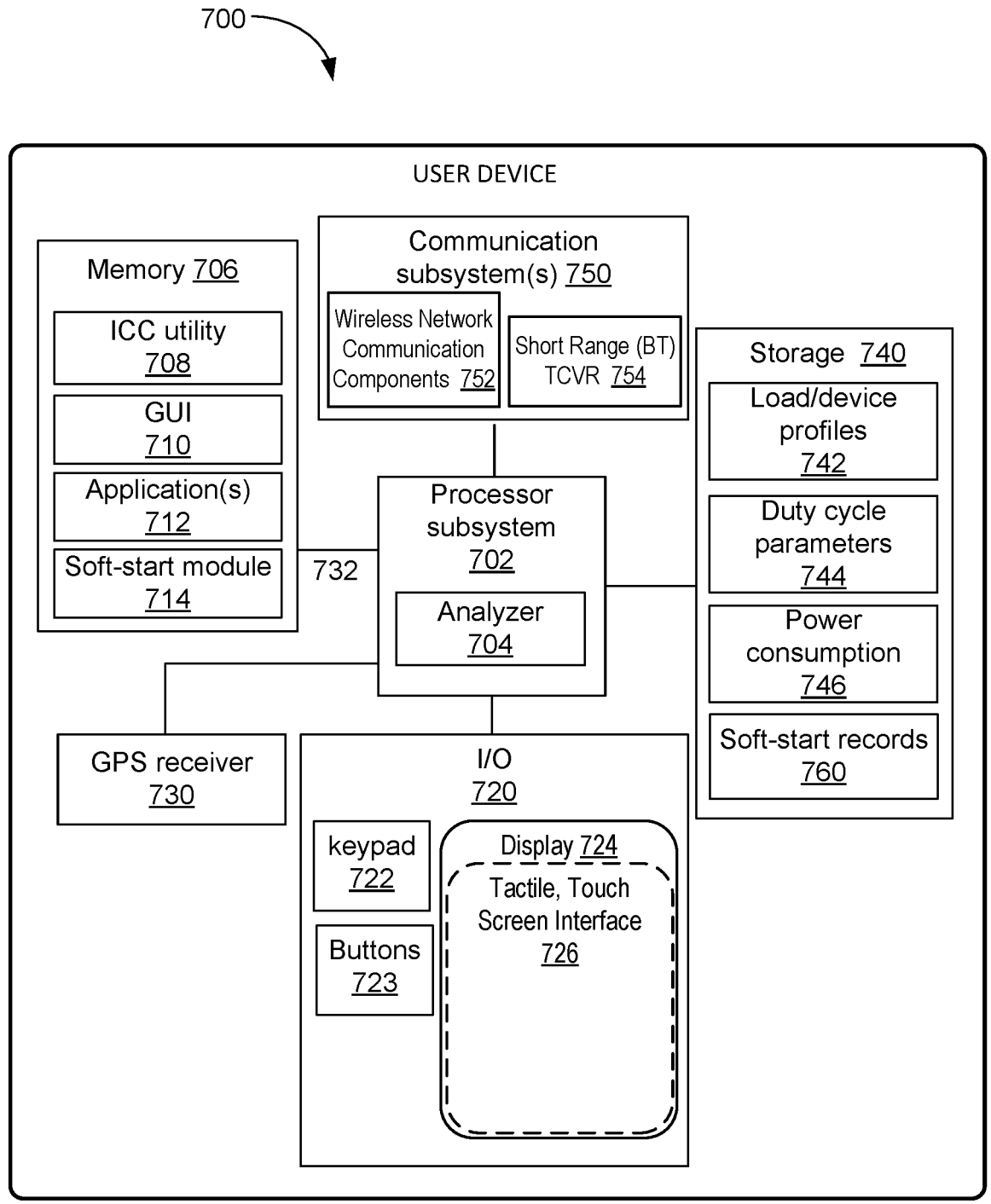
FIG. 7 illustrates a block diagram representation of an example data processing system within which certain features of the present disclosure can be implemented, according to one or more embodiments.

FIG. 7 illustrates a block diagram representation of an example user communication device, which is a data processing system (DPS) within which certain features of the present disclosure can be implemented, according to one or more embodiments. Generally, DPS may be a server, a digital audio workstation, a personal computer, a portable device, such as a personal digital assistant (PDA), a smart phone, and/or other types of electronic devices that may generally be considered processing devices or computing systems/devices. In the illustrative embodiments (e.g., FIG. 8), DPS is a user communication device such as a PDA or smart phone. As illustrated, DPS 700 comprises at least one processor subsystem 702 connected to system memory 706 via system interlink/bus 732. DPS 700 executes one or more computer programs/applications to provide programming instructions (which can include a version of the ICC utility 708) that can be used to configure a controller (e.g., controller 207 of FIG. 2) of an inrush control apparatus (ICA) to detect an inrush current condition and control power consumed in response to the inrush current condition, according to the present disclosure.

In one or more embodiments, data processing system 700 is managed by processor subsystem 702. DPS 700 also includes communication subsystem 750, data storage subsystem 740, and input/output (I/O) subsystem 720.

I/O subsystem 720 includes user interface devices, including output devices such as an audio output device(s)/speaker (not shown) and a display device 724. In one or more implementations, the display device 724 includes touch screen interface 726 and associated functionality enabling the display device 724 to function as both an input device and an output device. In addition, I/O subsystem 720 can include input devices including a microphone (not shown), a keypad 722, and physical or virtual buttons 723.

Processor subsystem 702 is communicatively coupled, via system bus/interlink 732, to device memory 706. In one or more embodiments, processor subsystem 702 is also communicatively coupled via system interlink 732 to communication subsystem 750, data storage subsystem 740, and input/output subsystem 720. System interlink 732 represents internal components that facilitate internal communication by way of one or more shared or dedicated internal communication links, such as internal serial or parallel buses. As utilized herein, the term "communicatively coupled" means that information signals are transmissible through various interconnections, including wired and/or wireless links, between the components.

Communication subsystem 750 may be configured to enable DPS 700 to communicate with a plurality of other computing devices. The communication subsystem may include wired and/or wireless communication components 752 to facilitate networked communication. Communication subsystem 750 also includes a Network Access Module by which DPS 700 may connect to one or more access/external networks such as the Internet or wide area network (WAN), or an internal network such as an Ethernet (local area network—LAN) or a Virtual Private Network (VPN) or a Personal Access Network (PAN).

Communication subsystem 750 includes a short-range communication transceiver 754, such as a Bluetooth transceiver (754). Communication subsystem 750 also includes GPS receiver 730 by which the device 700 can determine a geographic location and access power supply ratings of AC input power for a current location.

According to one or more aspects, communication subsystem 750 is configured to enable DPS 700 to communicate via Bluetooth or other communication protocol in order to provide programming instructions (which can include a version of the ICC utility 708) to the ICA 100.

In addition to the above-described hardware components of DPS 700, various features of the invention are completed/supported via software (or firmware) code or logic stored within memory 706 or other storage and executed by processor subsystem 702. Thus, for example, illustrated within memory 706 are a number of software/firmware/logic components, including Inrush Current Control (ICC) module/logic/utility 708, Soft-Start module 714 and other applications 712. Device memory 706 further includes an operating system (OS) (not shown), a firmware interface, such as basic input/output system (BIOS) or Uniform Extensible Firmware Interface (UEFI), and firmware (not shown). Device memory 706 includes a graphical user interface (GUI) 710, and/or other computer data (not explicitly shown) used/generated by the ICC utility 708 and/or the Soft-Start module 714.

As shown, processor subsystem 702 executes an analyzer module 704 to support the data analysis functionality of DPS 700, and processor subsystem 702 executes other program code to provide operating functionality of data processing system 700. The software and/or firmware modules have varying functionality when their corresponding program code is executed by processor subsystem 702 or secondary processing devices (not explicitly shown) within DPS 700.

Data storage subsystem 740 enables further storage and retrieval of data, instructions, and code. In particular, data storage subsystem 740 provides applications, program code, and stored data on nonvolatile storage that is accessible by processor subsystem 702. For example, data storage subsystem 740 can provide, for use by the ICC utility 708, the load/device profile data 742, duty cycle parameters/data 744, power consumption data 746, and soft-start records 760. In addition, data storage subsystem 740 can provide a selection of program code and applications such as soft-start module 714, and other related application(s) that can be downloaded to a memory of ICA 100 for execution by the controller 207 to enable ICA 100 to detect start-up related inrush current conditions and facilitate soft-start procedures in response to detecting an inrush current condition.

In actual implementation, the ICC logic 708 may be combined with the soft-start module 714 to provide a single executable component, collectively providing the various functions of each individual component when the program code of the corresponding combined component is being processed by processor subsystem 702 and/or controller 207. For simplicity, the ICC logic/utility 708 is illustrated and described as a stand-alone or separate logic/firmware component, which provides specific functions, as described below.

In one embodiment, DPS 700 communicates with a software deploying server (not shown) via a network (e.g., the Internet) using communication subsystem/network access module 750. Then, ICC utility 708 may be deployed from/on the network, via the software deploying server, and received at DPS 700.

The ICC utility 708 enables a user to establish configuration instructions for configuring the ICA 100 to enable a controller 207 of the ICA 100 to monitor power consumption during a load startup-up or restart in order to determine whether an inrush current condition exists, and to perform a soft-start, using duty-cycled power, responsive to detection of the inrush current condition. The individual/user can be presented, via an output device of the I/O subsystem, with audio, visual and/or textual content associated with the various stages of the process of establishing configuration instructions. According to one or more aspects, the user can be presented with aural content via the speakers. The participant may also be visually presented via the display device with image, video and/or textual content. In addition, the user may be visually presented with one or more associated selection buttons within the GUI 710. According to an aspect of the present disclosure, the ICC utility/module 708 enables the user to provide responses/feedback via the GUI 710 to the presented content. Using an input device, such as the mouse, the keypad or the microphone, the user can provide an input selection as a response to presented content.

Certain of the functions supported and/or provided by the ICC utility/module 708 are implemented as processing logic (or code) executed by processor subsystem 702 and/or controller 207 or other device hardware, and the processing logic enables the device to implement/perform those function(s). Among the software code/instructions/logic provided by the ICC module 708, and which are specific to the disclosure, are: (a) logic for performing continuous monitoring and evaluation of load power consumption based on load characteristics/requirements; (b) logic for determining whether an inrush current condition is detected; (c) logic for utilizing a dual soft-starter to initiate a soft-start procedure responsive to detecting one or more inrush current conditions; (d) logic for determining duty cycled power parameters, including a power ramp rate, to facilitate a soft-start procedure, based on load consumption and load characteristics/requirements; (e) logic for activating TRIAC(s)/regulator(s) that are configured/controlled using the duty cycled power parameters; (f) logic for de-activating relay(s), disabling a continuous application of source power to a load; (g) logic for detecting duty-cycled power having a first power level being applied to a particular load; (h) logic for detecting duty-cycled power having a second power level being applied to the particular load; (i) logic for re-activating the relay(s) to reconnect the continuous power source, and disengaging the TRIAC. According to the illustrative embodiment, when Processor subsystem 702 executes the ICC logic/module 708, DPS 700 initiates a series of functional processes that enable the above functional features as well as additional features/functionality. These features/functionalities are described in greater detail within the description of FIGS. 1-6 and 8-13.

Those of ordinary skill in the art will appreciate that the hardware components and basic configuration depicted in FIG. 7 may vary. The illustrative components within DPS 700 are not intended to be exhaustive, but rather are representative to highlight essential components that are utilized to implement the present disclosure. For example, other devices/components may be used in addition to or in place of the hardware depicted. The depicted example is not meant to imply architectural or other limitations with respect to the presently described embodiments and/or the general disclosure.

Figure 8:
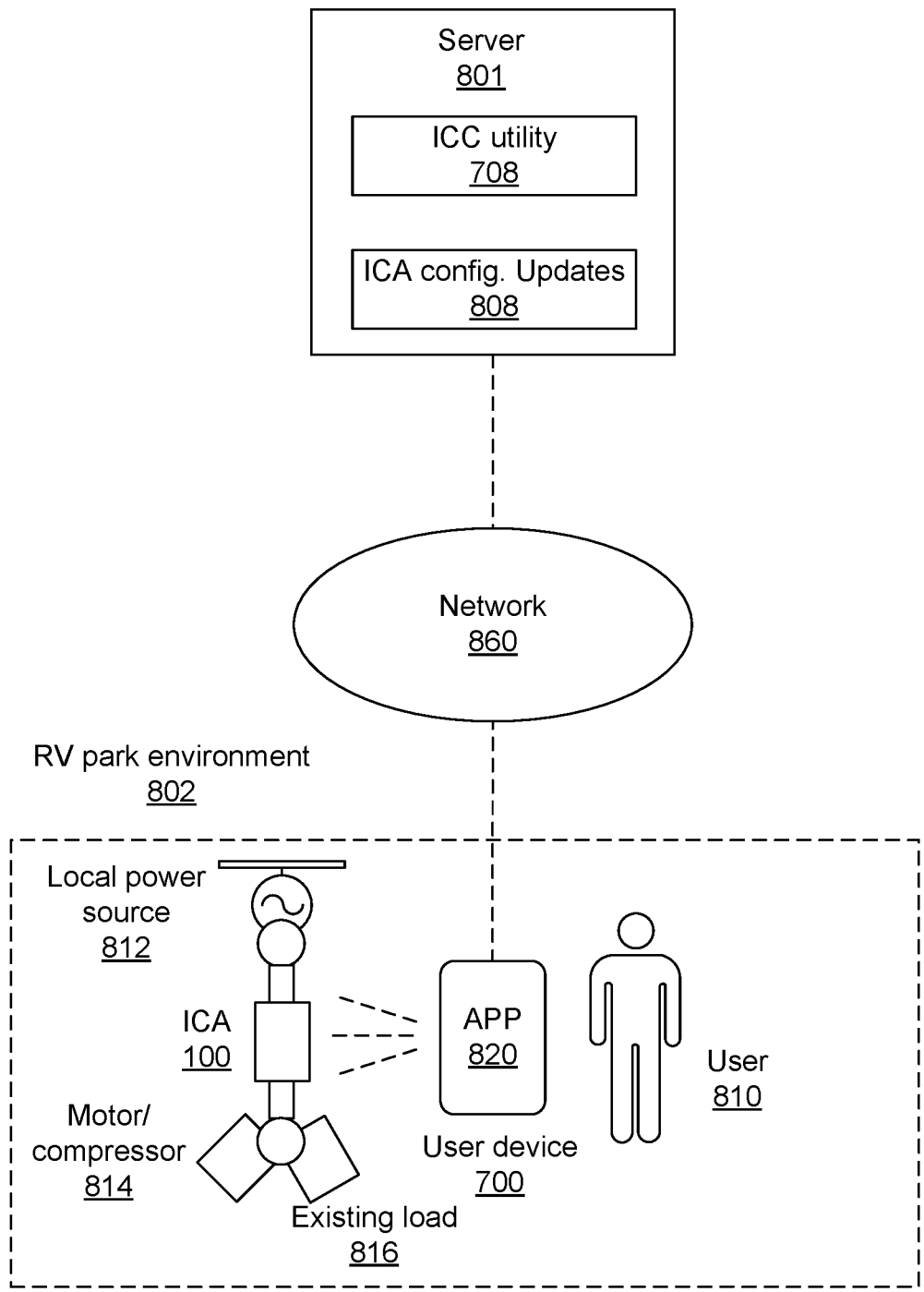
FIG. 8 illustrates a computer network for enabling a user of the ICA to establish and download ICA configuration instructions via a software application in order to configure the ICA, according to one or more embodiments of the disclosure.

Referring now to FIG. 8, there is illustrated a computer network for enabling a user of the ICA to establish and download ICA configuration instructions via a software application in order to configure the ICA, according to one or more embodiments of the disclosure. As illustrated in the computer network 800, a number of computing/electronic devices are included. These computing devices, which can be similarly configured to DPS 700 (FIG. 7), include a server 801 and a communication device(s) 700, which is referred to as user device 700. The various computing devices are connected by a network 860. The network 860 can be any of the various networks, including a LAN or a WAN/Internet, described in FIG. 7.

The computer network 800 allows load characteristics such as power requirement profiles or information to be sent by the server to an individual user device. Based on the communicated/received information, the ICC utility/module 708 can download configuration and control information, such as ICA configuration updates 808, to the user device.

According to one or more aspects, and as illustrated in FIG. 8, a user 810 with his user devices 700 (FIG. 7) is shown within a RV Park environment 802. According to one or more aspects, the user devices 700 include a personal/laptop/tablet computer and a smart-phone. As illustrated, an App 820, such as an ICC application and/or a soft-start application, is installed on the user device 700 (FIG. 7). Also included in the RV Park environment 802 is an ICA 100 and a local power source/grid 812 to which the ICA 100 is electrically coupled. In addition, the RV Park environment 802 includes an inductive load, such as a motor/compressor 814 of an air conditioning unit, which is electrically connected to the ICA 100. Also illustrated is already existing/operating load 816 which is electrically connected to the ICA 100.

According to an aspect, by continuously monitoring power consumption, the controller 207 of ICA 100 is configured to determine an amount of power utilized by already existing/operating load 816 at an initiation of a start-up phase for an additional load 814. The already existing load 216 can include one or more operating devices/appliances. The already existing load 816 utilizes and/or requires an identified power level to maintain steady state operation. For example, the controller is able to determine that the already existing load 816 collectively requires five (5) Amperes of current to maintain steady state operation of each of the individual devices/appliances that constitute the already existing load 816.

The controller 207 is able to determine that the additional load 814 is an inductive load that requires a peak power/current level associated with current inrush at start-up. Theoretically, if a power source were able to instantaneously supply the peak power level, the load could be started within a minimum time interval. However, the controller is configured to execute a start-up process by utilizing a peak soft-start power that is a specified portion of the peak power level by spreading power supplied to the load over a soft-start starting interval that is extended/increased relative to the minimum time interval. Thus, for example, if the peak current level is 60 amperes, the controller can be configured to execute the soft-start using a peak soft-start current of 30-35 amperes.

According to an aspect, the controller is configured to achieve the peak soft-start power/current within a portion of the soft-start starting interval. The controller identifies an initial voltage and increases voltage provided across the load from the initial voltage towards an intermediate voltage at which the peak soft-start power is achieved. The controller continues to increase the voltage until the full voltage is achieved towards an end of the soft-start interval.

According to an implementation, if the already existing load 816 requires 5 amperes and the new/additional load 814 can be soft-started using a peak soft-start current of 30 amperes, then the controller can execute the soft start to enable the soft-start module to be capable of providing 35 amperes (i.e., 30+5) of current to the total load (i.e., the already operating load 816 and the additional load 814) during each cycle. During the soft-start period, the additional load 816 is able to support and maintain steady state operation using substantially less power/current than the peak soft-start power/current level. For example, the additional load 816 may require ten (10) amperes of current to maintain steady state operation.

Figures 9A, 9B:
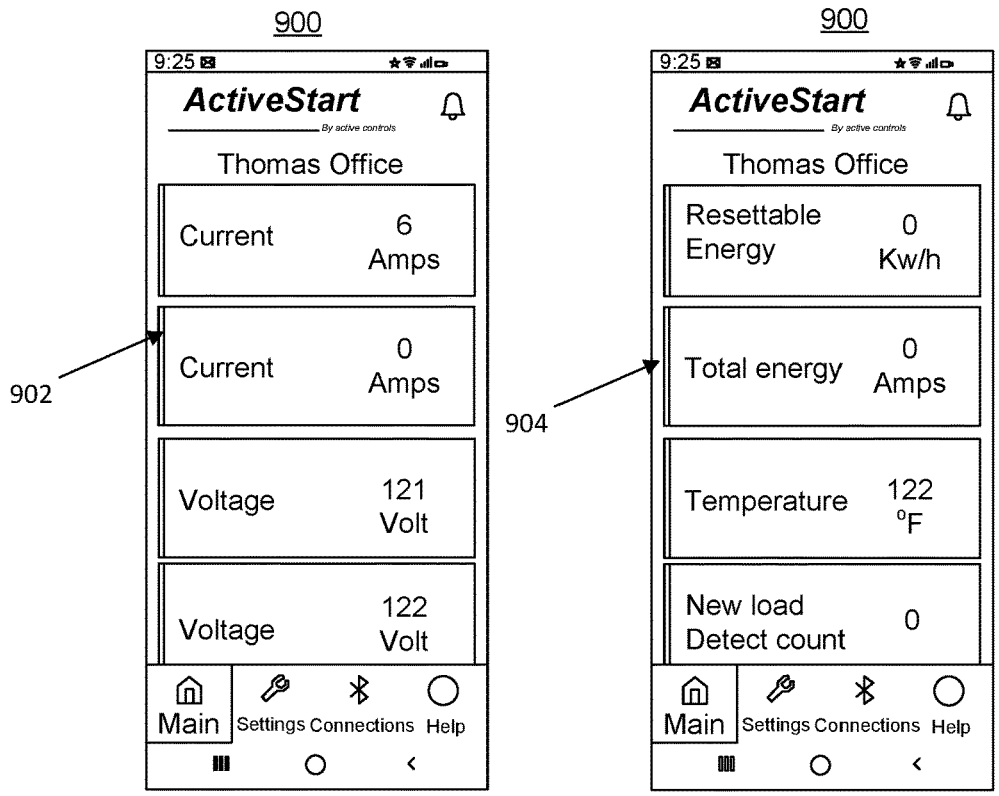
FIGS. 9A-9C illustrate first screenshots of various example interfaces of a software application used for enabling a user to configure the ICA, according to one or more embodiments of the disclosure.
Figure 9C:
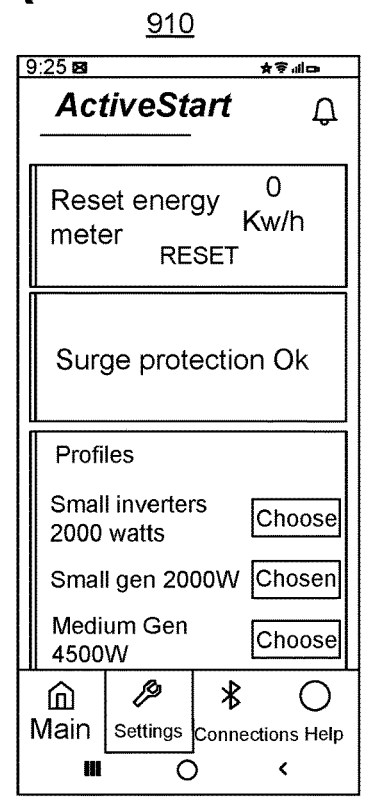

FIGS. 9A-9C illustrate first screenshots of a various example interfaces of a software application used for enabling a user to configure the ICA, according to one or more embodiments of the disclosure. FIGS. 9A and 9B show different sections of the App Home Screen 900. The App provides programming instructions that enable ICA 100 to be configured to measure individual current for L1 and L2, measure voltages corresponding to L1 and to L2, and perform power calculations for L1 and for L2. The home screen is scrollable, enabling a user to scroll up from a first section 902 (shown in 9A) to a second section 904 (shown in 9B) to see additional information contained on the screen. The home screen 900 serves as the Status screen, where a user is able to review the various parameters being measured by the ICA 100. According to one or more embodiments, the parameters include voltage, current, frequency, temperature, etc. Other information being displayed on the home screen 900 are counters and calculated power based on voltage and current.

FIG. 9C shows the settings screen 910. The settings screen 910 allows the ICA 100 to operate with enhanced efficiency when setting a power source. When the ICA 100 operates with enhanced efficiency, the user can become aware of the limit of peak power that the device is capable of handling and can be provided with optimized settings. When the user selects a different profile, the parameters for power percentage and ramp rate are changed. Once the user selects a different profile based on the power source, the message will change from "choose" to "chosen" and will be displayed in green text or message highlighting. In addition, on this screen, the user can monitor the status of the surge protection and can reset an energy meter.

According to one or more aspects, the App is installed on an electronic/computing device, enabling the electronic device to configure the ICA 100 (FIG. 1) to control inrush current. According to one or more embodiments, the electronic device can be a laptop, a smart-phone or other computing device. According to one or more embodiments, the electronic device includes a display, at least one input device, and an interface device that enables the electronic device to communicatively connect to an apparatus. The electronic device also includes a memory having stored thereon an application (App) for receiving configuration data and for presenting status information about the apparatus. According to one or more embodiments, the App, which is stored in memory of the electronic device, is an application for receiving configuration data and for presenting status information about the apparatus. A processor of the electronic device is communicatively coupled to the display, the at least one input device, the interface device, and to the memory. The processor executes program code of the application, which enables the electronic device to present, on a display of the electronic device, a graphical user interface (GUI) for the application. The processor receives, from a user interfacing with the GUI via an input device, parameters for configuring the ICA to provide a soft-start of a load. The parameters include duty cycled parameters associated with characteristics of the load. The electronic device transmits, via an interface device, the configuration parameters to the ICA. In addition, the processor receives one or more of status information and alerts from the ICA.

According to one or more embodiments, the electronic device monitors for wireless signals propagated by one or more external devices broadcasting a soft-start capability. In response to detecting a wireless signal of the apparatus indicating soft-start capability, the processor retrieves a MAC address for the apparatus. In addition, the processor retrieves a unique pass key based on the MAC address and applies the unique pass key to enable the application to complete a pairing of the apparatus with the electronic device, wherein the pairing enables the electronic device to configure the apparatus.

According to one or more embodiments, the electronic device further include a network interface that enables the electronic device to connect to one or more network-accessible devices. According to an aspect, the application comprises program instructions for configuring the apparatus to perform one or more of: measurement of current flow through respective power connector lines; measurement of voltages corresponding to respective power connector lines; and power calculations for respective power connector lines.

According to one or more embodiments, the processor downloads from a server one or more of: a configuration updates file; a firmware update file to update firmware of the apparatus; and power requirement profiles for respective loads. The processor enables the user to transmit configuration updates and firmware update instructions to the apparatus using the configuration update file and the firmware update file. Additionally, the processor displays, for user review, values for various parameters being measured or calculated by the apparatus. The parameters comprise one or more of voltage, current, power, frequency, and temperature.

According to one or more embodiments, the processor determines, using a power requirement profile, a limit of peak power that a device providing/representing the load is capable of utilizing. The processor generates, based on the limit of peak power, optimized parameter settings for the load, wherein said optimized parameter settings include parameters including one or more of (i) a target percentage of power and (ii) a ramp rate. The parameters are utilized for configuring a thyristor. In addition, the processor enables the user to select a different power requirement profile for the load. Furthermore, the processor modifies values for the parameters for target power percentage and ramp rate, based on the different power requirement profile selected.

Figure 10A:
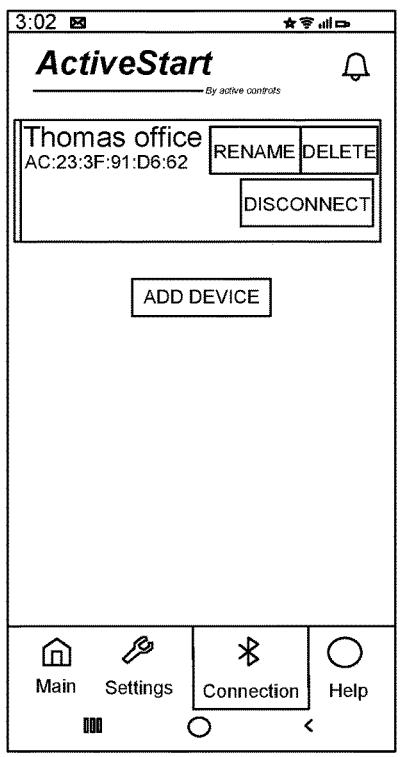
FIGS. 10A-10C illustrate second screenshots of various example interfaces of a software application used for enabling a user to configure the ICA, according to one or more embodiments of the disclosure.
Figure 10B:
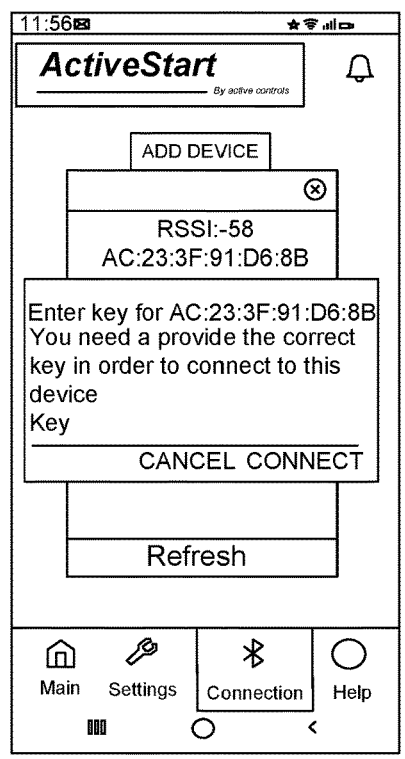
Figure 10C:
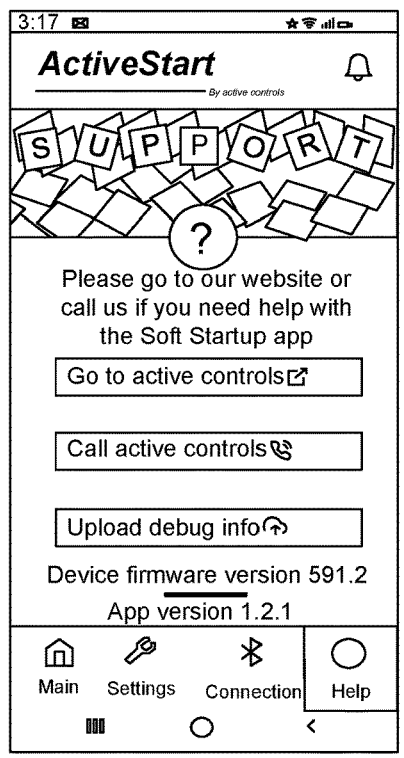

FIGS. 10A-10C illustrate second screenshots of various example interfaces of a software application used for enabling a user to configure the ICA, according to one or more embodiments of the disclosure. FIG. 10A shows the Bluetooth Connection Screen 1000 which is used to add new devices via the App by scanning for available ICAs that will be broadcasting the soft-start capability. In FIG. 10B, the ICA that is targeted to receive programming instructions (which instructions can include a version of the ICC utility 708) can be selected and accessed via the corresponding screen 1010. Once found, the MAC address of the ICA 100 will be seen. To continue the pairing, each ICA will have a unique pass key containing N characters, where N is an integer number, such as eight. The unique pass key will be entered into the APP to complete the pairing. Once added, the user can change the name of the ICA for easier reference when multiple ICAs are being controlled from the user device.

FIG. 10C shows the Help and Update Screen 1020. The user can access this screen 1020 to contact the manufacturer or vendor for support. In addition, the user can go to this screen 1020 to generate a debug file that allows him to view the configuration and also the faults that have occurred in that ICA unit. Additionally, the user will be able to update ICA firmware either through a file that will be downloaded from the cloud (e.g., server 801) or sent via email to the user enabling the user to update the ICA. The availability of this downloadable firmware update eliminates the need for the ICA to be sent back to a manufacturer/vendor for updating.

Figure 11:
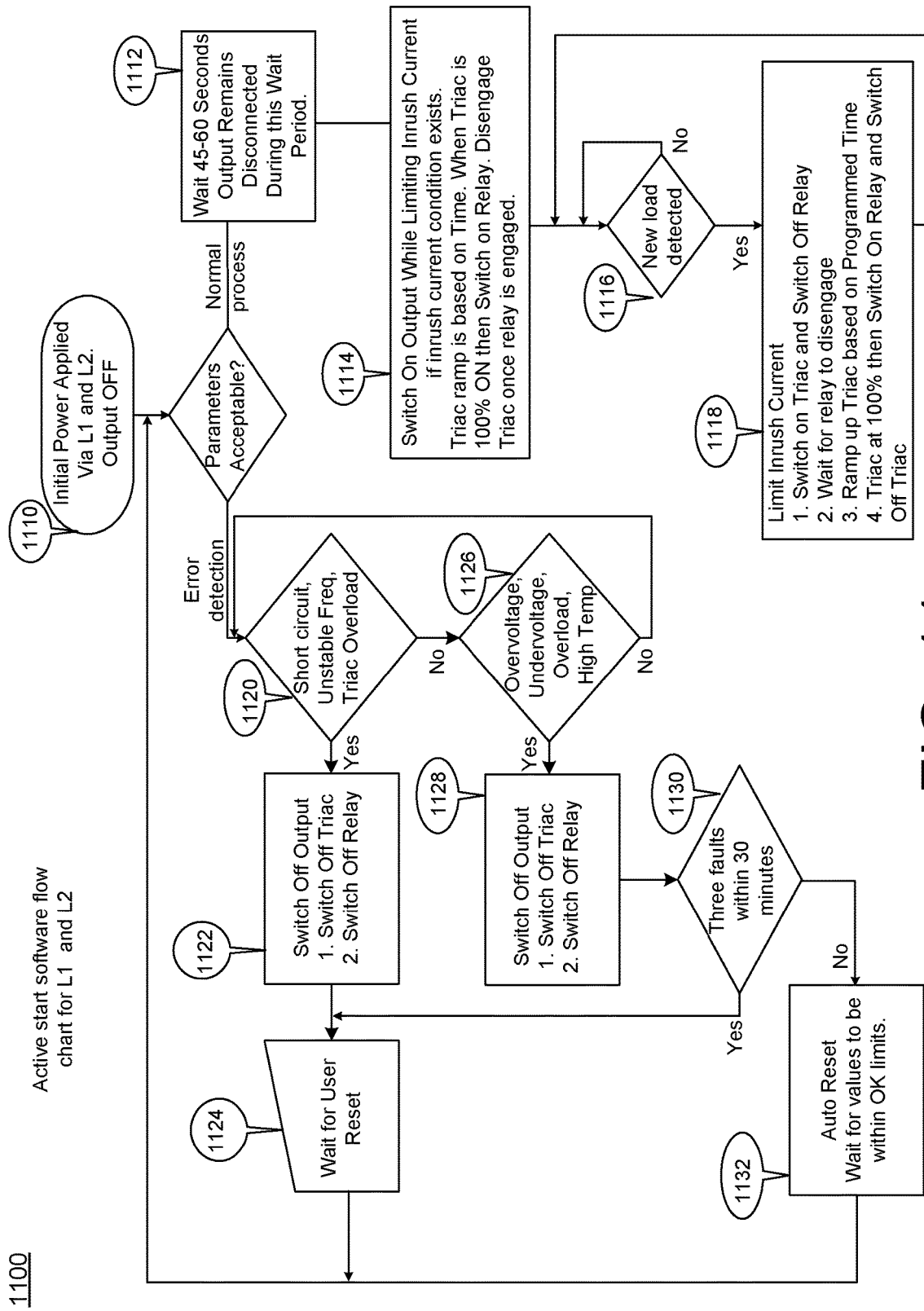
FIG. 11 presents a flow chart illustrating the process of providing inrush current control using a soft-start procedure for two hot wire lines, according to one or more embodiments.
Figure 12:
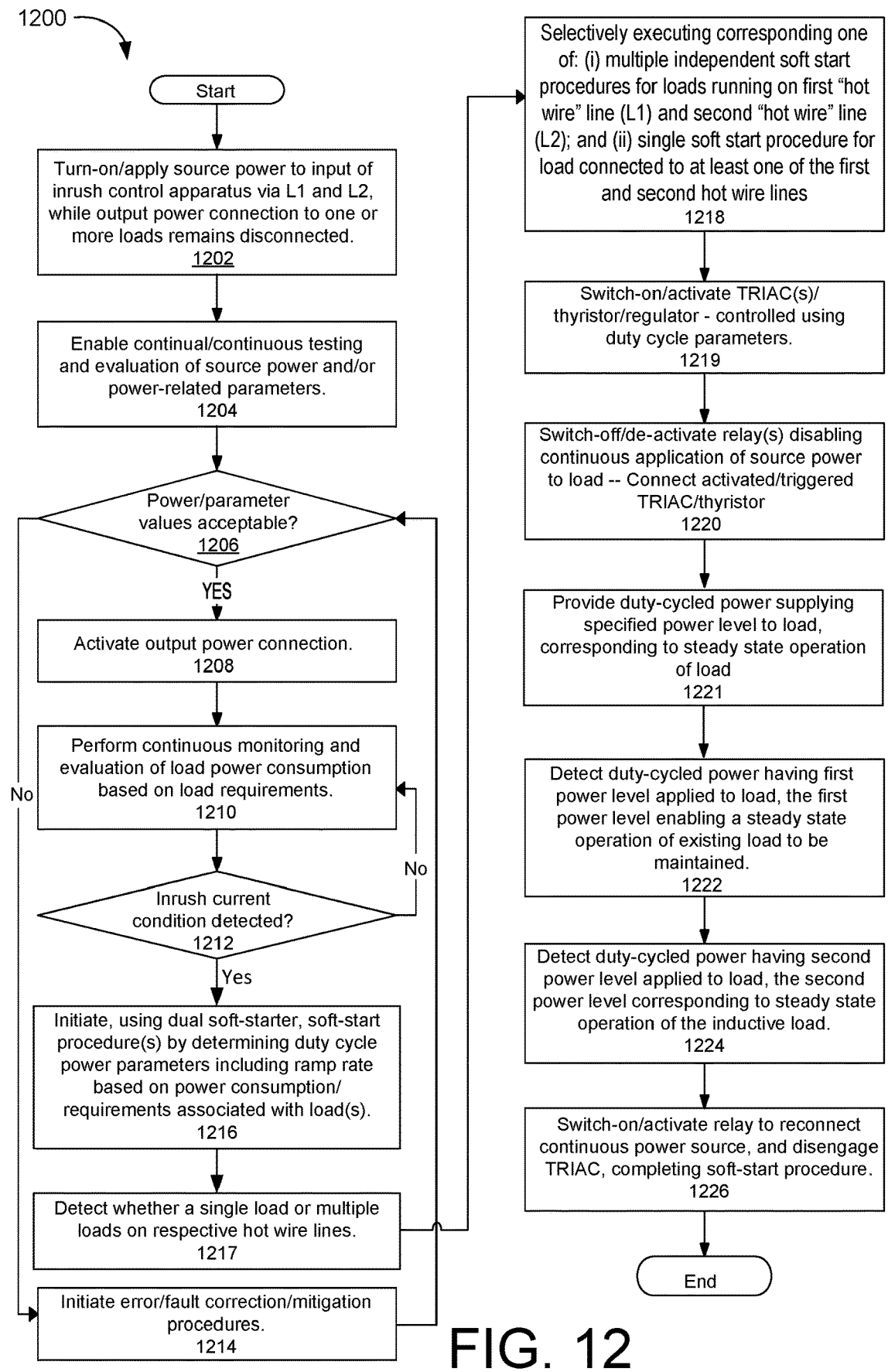
FIG. 12 presents a flow chart illustrating the process of providing inrush current control using a soft-start procedure that maintains steady state operation of already existing load(s), according to one or more embodiments.

FIGS. 11-12 are flow diagrams/charts illustrating various methods by which the above processes of the illustrative embodiments are completed. Although the methods illustrated in FIGS. 11-12 may be described with reference to components shown in FIGS. 1-10, it should be understood that this is merely for convenience and alternative components and/or configurations thereof can be employed when implementing the various methods. Key portions of the methods may be respectively completed by the Inrush Current Control (ICC) module 708 executing on processor subsystem 702 within DPS 700 (FIG. 7) and/or by a controller 207 within ICA 100 (FIG. 1) and controlling specific operations of/on ICA 100. The methods are thus described from the perspective of either/both the ICC module 708 and ICA 100 or other device that provides the functionality associated with one or more versions of the ICC module 708.

FIG. 11 presents a flow diagram illustrating the process of providing inrush current control via an inrush control apparatus (ICA) using a soft-start procedure for two hot wire lines (i.e., L1 and L2), according to one or more embodiments. Blocks 1110-1118 illustrate operation of ICA 100 during a normal startup, i.e., when no startup errors occur. This normal start-up process is further described by the flowchart of FIG. 12. As illustrated, at block 1110, AC power is initially applied to the ICA 100 while the output power to the load remains OFF. At block 1112, the output power connection to the load remains OFF/disconnected during a pre-established waiting period. At block 1114, the output power connection to the load is connected following a pre-established waiting period. In addition, at block 1114, the controller performs a number of operations which include determining whether an inrush current condition exists, and activating (i.e., switching on) a relay when a thyristor/TRIAC is fully activated. At block 1116, the controller determines whether a new (inductive) load is detected while the inrush condition exists. At block 1118, the controller performs a number of operations to limit inrush current to the new load. These operations include activating the TRIAC and ramping up power via the TRIAC. Furthermore, in response to the power being fully ramped up as a result of the TRIAC being fully activated, the controller switches on the relay and disengages the TRIAC.

Blocks 1120-1132 illustrate operation upon detection of one or more startup errors/faults. According to one or more aspects, errors of a first class type occur when the controller detects a short circuit, unstable supply frequency, or overload current (block 1120) through the TRIACS, triggering the controller to switch off the output power connection to the load (block 1122). According to one or more aspects, errors of a second class type occur when the controller detects an over-voltage, undervoltage or high temperature condition (block 1126), triggering the controller to switch off the output power connection to the load (block 1128). According to an aspect, removing or mitigating the first class of errors can involve utilizing a manual/user reset, as shown at block 1124. According to an aspect, removing or mitigating errors from among the second class type can involve utilizing a manual/user reset (block 1124) if at least a preset number of errors/faults occur within a specified time period (e.g., at least three faults within 30 minutes, as shown at block 1130). However, if less than the preset number of errors/faults occur within the specified time period, the controller 207 can perform an automatic reset that is likely to mitigate less frequently occurring errors/faults (block 1132).

FIG. 12 presents a flow chart illustrating a method 1200 of providing inrush current control using a soft-start procedure that maintains steady state operation of already existing load, according to one or more embodiments. The method 1200 involves a series of processes that are performed by controller 207 and/or specifically execution of ICC module 708 by processor component 702 of controller 207 operating within ICA 100. For simplicity, the method 1200 will be described as being performed by controller 207. The method 1200 (processes) of FIG. 12 begins at the initiator/start block and proceeds to block 1202, at which the controller 207 detects when AC source power is turned on and/or applied to an input of the ICA via L1 and L2. The detection can occur while an output power connection that can be removably coupled to one or more loads remain deactivated/disconnected. At block 1204, the controller enables continual/continuous testing and evaluation of source power and/or power-related parameters. At decision block 1206, the controller 207 determines whether the measured power/parameter values are acceptable. If the measured power/parameter values are unacceptable, the controller 207 initiates error/fault correction/mitigation procedures, as shown at block 1214. However, if the measured power/parameter values are acceptable, the controller 207 activates the output power connection, as shown at block 1208.

At block 1210, the controller 207 performs continuous monitoring and evaluation of load power consumption based on load characteristics/requirements. At decision block 1212, the controller 207 determines whether an inrush current condition is occurring or detected. If, at decision block 1210, the controller 207 determines that an inrush current condition is not occurring/detected, the process returns to block 1206. However, if the controller 207 determines that an inrush current condition is occurring/detected, the controller 207 uses a dual soft-starter to initiate one or more soft-start procedures by determining duty cycle power parameters including a ramp rate based on power consumption and load characteristics and/or requirements, as shown at block 1216.

According to one or more aspects, the controller 207 detects the occurrence of an inrush current condition when an inductive load begins to draw/consume power (e.g., at start-up). According to an aspect, a number of non-inductive loads, such as lights, a television, a radio, and other appliances, may begin drawing power without triggering an inrush current condition. Thus, if the controller 207 determines that an inrush current condition is not occurring/detected, the controller 207 maintains the output power connection to the load while continuing to monitor and evaluate load power consumption (block 1206).

In one or more embodiments, the controller detects/determines whether a single load or multiple loads are connected to respective hot wire lines of the apparatus (block 1217). The controller initiates the soft-start procedure by executing a corresponding one of: (i) multiple independent soft start procedures for different loads running on a first "hot wire" line (L1) and a second "hot wire" line (L2), respectively; and (ii) a single soft start procedure for a single load connected to at least one of (both the first and second hot wire lines (block 1218). At block 1219, the controller 207 activates the Thyristor or TRIAC(s), which is a leading-edge regulator, controlled utilizing the duty cycle parameters. The controller 207 connects the activated/triggered TRIAC/thyristor and de-activates the relay(s), disabling continuous application of source power to a particular load, as shown at block 1220. In the illustrated embodiments, connecting the TRIAC/thyristor is completed by switching off the relays. At block 1221, the controller 207 provides, via the thyristor, duty-cycled power supplying a specified power level to the particular load, the specified power level corresponding to steady state operation of the particular load. At block 1222, the controller 207 detects duty-cycled power providing a first power level being connected/applied to the particular load. According to one or more aspects, the first power level is sufficiently large to enable devices/appliances that have been operating via a first state, such as steady state operation, using a continuously supplied source power to remain within the first state using duty cycled power supplied by the Thyristor or TRIAC. According to an aspect, the first power level represents a first percentage of steady state power of the AC power source. According to an aspect, the percentage of steady state power of the AC power source represents the ON-time of the Thyristor or TRIAC, the ON-time further determining an amount of current that is supplied to the particular load. According to one or more aspects, based on the ramp rate, the controller 207 gradually increases the power level of the duty cycled power from a first power level to one or more other power levels, before attaining a second power level within a specified time period. According to an aspect, the second power level corresponds to steady state operation of an inductive load.

At block 1224, the controller 207 detects duty cycled power providing the second power level being supplied to the particular load. The controller 207 activates the relay in order to reconnect the continuous power source and disengages the TRIAC(s) to complete the soft-start procedure, as shown at block 1226. The process then terminates, as indicated by the end block.

Accordingly, one implementation of the above-described features of the disclosure provides a method for controlling inrush current to a load. The method 1200 includes supplying alternating current (AC) source power to an apparatus. The apparatus comprises a first connector adapted to connect to an AC outlet and having multiple hot wire lines to further connect each hot wire line to a different thyristor, which is connectable to a same load or to a separate load from another thyristor connected to another hot wire line. The apparatus includes a second connector adapted to connect to one or more loads and supply power to the one or more loads and control circuitry connected between the first and second connectors and comprising multiple soft-start circuit modules and a surge protection circuit module for protecting the one or more loads from voltage and current surges, the control circuitry further comprising a controller that processes programming and configuration instructions while the apparatus is connected to the AC source. The method includes, in response to detecting connection of the one or more loads to the second connector, continuously evaluating load power consumption for each load of the one or more loads based on corresponding load characteristics. The method includes determining, based on the evaluation of the load power consumption, whether an inrush current condition is detected for a particular load. The method includes, in response to detecting the inrush current condition, initiating a soft-start procedure comprising triggering the thyristor to provide duty-cycled power using duty cycled parameters associated with characteristics of the particular load. In one or more embodiments, the method includes detecting whether a single load or multiple loads are connected to respective hot wire lines of the apparatus. The method also includes initiating the soft-start procedure by selectively executing a corresponding one of: (i) multiple independent soft start procedures for loads running on a first "hot wire" line (L1) and a second "hot wire" line (L2), respectively; and (ii) a single soft start procedure for a load connected to at least one (or both) the first and second hot wire lines. The method includes: connecting the triggered thyristor to the particular load by switching off a relay to disconnect the AC source power from the particular load; and providing, via the thyristor, duty-cycled power supplying a specified power level to the particular load, the specified power level corresponding to steady state operation of the particular load. The method includes completing the soft-start procedure by connecting the AC source power to the particular load and disengaging the thyristor, in response to detecting the duty-cycled power having a second power level that corresponds to steady state operation of the particular load.

According to one or more embodiments, the determining further includes: measuring current and voltage characteristics of one or more individual hot wire lines of the second connector to which the one or more loads are connected in order to receive the AC source power; determining whether one or more of a threshold increase in instantaneous load current consumption level and a threshold decrease in an instantaneous voltage associated with the particular load has occurred; and in response to determining that one or more of the threshold increase in instantaneous load current consumption level and the threshold decrease in an instantaneous voltage has occurred, determining that the inrush current condition exists, indicative of an inductive load being started.

According to one or more embodiments, the method 1200 further includes supplying power to a collective load comprising the particular load added to an already operating load, where the particular load is an added load comprising one or more operating devices or appliances. In order to perform continuous evaluation of load power consumption, the method further includes: determining an amount of power utilized by the already operating load at a time of an initiation of a start-up phase for the added load, where the already operating load utilizes an identified power level to maintain steady state operation. The method includes: determining, based on pre-established load characteristics and the amount of power utilized by the already operating load for steady state operation, a peak soft-start current required to soft-start the added load; and determining, using the peak soft-start current for the added load and the amount of power utilized by the already operating load, an amount of current required by the collective load during each cycle of a soft-start period to successfully execute a soft-start procedure using the soft-start circuit module. The method includes, in response to initiating the soft-start procedure, providing, via the thyristor, duty-cycled power supplying a first power level to the already operating load, based on the amount of current utilized by the already operating load, the first power level capable of enabling steady state operation of the already operating load to be maintained. The method includes, in response to initiating the soft-start procedure, providing, via the thyristor, duty-cycled power supplying a second power level to the added load, based on the amounts of current utilized by the already operating load and required by the collective load, respectively, the second power level corresponding to steady state operation of both the already operating load and the added load, where the second power level is the specified power level.

According to one or more embodiments, the method 1200 includes: performing pulse width modulation (PWM) to control the thyristor to supply an output voltage representing duty-cycled power; and maintaining, during the soft-start cycle, steady state operation of the added load using the second power level which is a predetermined amount of power less than the peak soft start power level.

According to one or more embodiments, the surge protection circuit module includes one or more fuses, each having a specific current rating, and surge protection components which include voltage suppression components. Each of the fuses is connected to one or more voltage suppression components coupled to one or more of a Neutral line and a Ground line, respectively, and the one or more voltage suppression components are rated to absorb a specified amount of energy and can be damaged if the specified amount of energy is exceeded. The method 1200 further includes: measuring a voltage across a fuse connected to a corresponding hot wire line in order to determine whether current flows through the fuse; in response to not detecting current flow through the fuse, identifying one or more of surge voltage and surge currents resulting in a blown fuse as a likely cause of a detected lack of current flow through the fuse; equating blown surge protection components as a likely result of the one or more of surge voltage and surge currents; and providing an indication that at least one of a corresponding surge protection component and a circuit board should be replaced, based on identifying that the detected lack of current flow is likely a result that can be associated with blown surge protection components.

According to one or more embodiments, performing the soft-start procedure further includes: gradually increasing power being supplied to the particular load from a first power level to a peak soft-start power level, utilizing a specified ramp rate derived from one or more power supply demand profiles of various operating load components. The controller executes the soft start procedure within a control period selected relative to a start-up time of the particular load to enable sufficient reduction and mitigation of the inrush current condition.

According to one or more embodiments, the method 1200 further includes detecting whether a single load or multiple loads are connected to respective hot wire lines of the apparatus and selectively executing one or more of: multiple independent soft start procedures for loads running on a first "hot wire" line (L1) and a second "hot wire" line (L2), respectively; and a single soft start procedure for a load connected to both the first and second hot wire lines. In one or more embodiments, selectively executing one or more of: multiple independent soft start procedures for loads running on a first "hot wire" line (L1) and a second "hot wire" line (L2), respectively; and a single soft start procedure for a load connected to at least one of the first and second hot wire lines further includes: in response to use of the apparatus to power a single load connected to a single one of the first hot wire line and the second hot wire line, providing a steady state power of a first power level; and in response to use of the apparatus to power two separate loads, each connected on one of the first and the second hot wire lines, respectively, channel a first voltage level to each of the first hot wire line and the second hot wire line to separately power respective first and second loads. Also, in response to use of the apparatus to power a single load requiring a larger voltage than the first voltage level: receive input power at the first voltage level on the first hot wire line; receive input power at the first voltage level out-of-phase with the first phase on the second hot wire line; and provide a combined voltage level of a multiple greater than 1 of the first voltage level to the single load.

As described herein, a method, a system, and a computer program product for controlling inrush current demand at device startup is disclosed. An inrush control apparatus (ICA) having power monitoring and power limiting circuitry determines whether one or more loads are electrically connected to an alternating current (AC) source. In response to detecting connection of the one or more loads to the AC source, a controller of the ICA continuously evaluates load power consumption based on load characteristics. The controller determines, based on the evaluation of the load power consumption, whether an inrush current condition is detected. In response to detecting an inrush current condition, the controller uses a dual soft-starter to initiate one or more soft-start procedures comprising triggering, using duty cycled parameters associated with characteristics of a particular load, a thyristor to provide duty-cycled power. The controller connects the triggered thyristor to the particular load by switching off a relay to disconnect the AC source power from the particular load. As a result, the controller provides, via the thyristor, duty-cycled power supplying a specified power level to the particular load, the specified power level corresponding to steady state operation of the particular load. In response to attaining steady state operation of the particular load, the controller completes a soft-start procedure by connecting the AC source power to the particular load and disengaging the thyristor.

According to one or more aspects, the apparatus performs the above presented functional features of the method 1200 via processing by the controller of code stored on a memory of the apparatus/controller. Accordingly, the ICA is configured to execute independent soft start procedures for loads running on a first "hot wire" line (L1) and a second "hot wire" line (L2), respectively. According to another aspect, the ICA is configured to execute a soft start procedure for a load utilizing both the first and second hot wire lines.

According to one or more embodiments, the controller sets an optimal power duty cycle causing the thyristor/TRIAC/regulator to clip or chop the power waveform at a time instant within a selected time range that follows a start of the power cycle to provide the first power level. According to an implementation, the selected time range is the 100-300 msec range of the power cycle. According to an aspect, the first power level represents a first percentage of steady state power of the AC power source.

According to an aspect, an inrush current control (IDC) application running on a mobile/portable device enables an operator to provide the optimal power duty cycle by setting a power level and a ramp rate that best suits the power supply demand profiles of the various loads/appliances.

According to one or more aspects, the controller executes the soft start procedure within a control period appropriately selected relative to a start-up time of the load. The selected control period enables a removal and/or adequate/optimal reduction of the inrush current demand/condition.

According to one or more aspects, the controller triggers the TRIAC to clip or chop the power/current waveform to provide the required power level, closes the switch/relay to enable the power source to provide the steady state current required by the load (e.g., a motor/compressor), and disengages the TRIAC. According to an aspect, the required power level represents a second percentage of steady state power supplied by the AC power source.

According to one or more aspects, the controller provides pulse width modulated (PWM) control signals to the gates of the TRIACs to trigger the TRIACs to supply regulated power/current to the load.

One additional implementation of the above-described features of the disclosure provides a computer program product for configuring an apparatus for controlling inrush current. The computer program product includes: a computer readable storage device having stored thereon program code which, when executed by at least one processor of an electronic device having a display and a memory, enables the electronic device to complete functionality of the above-described method.

Figure 13:
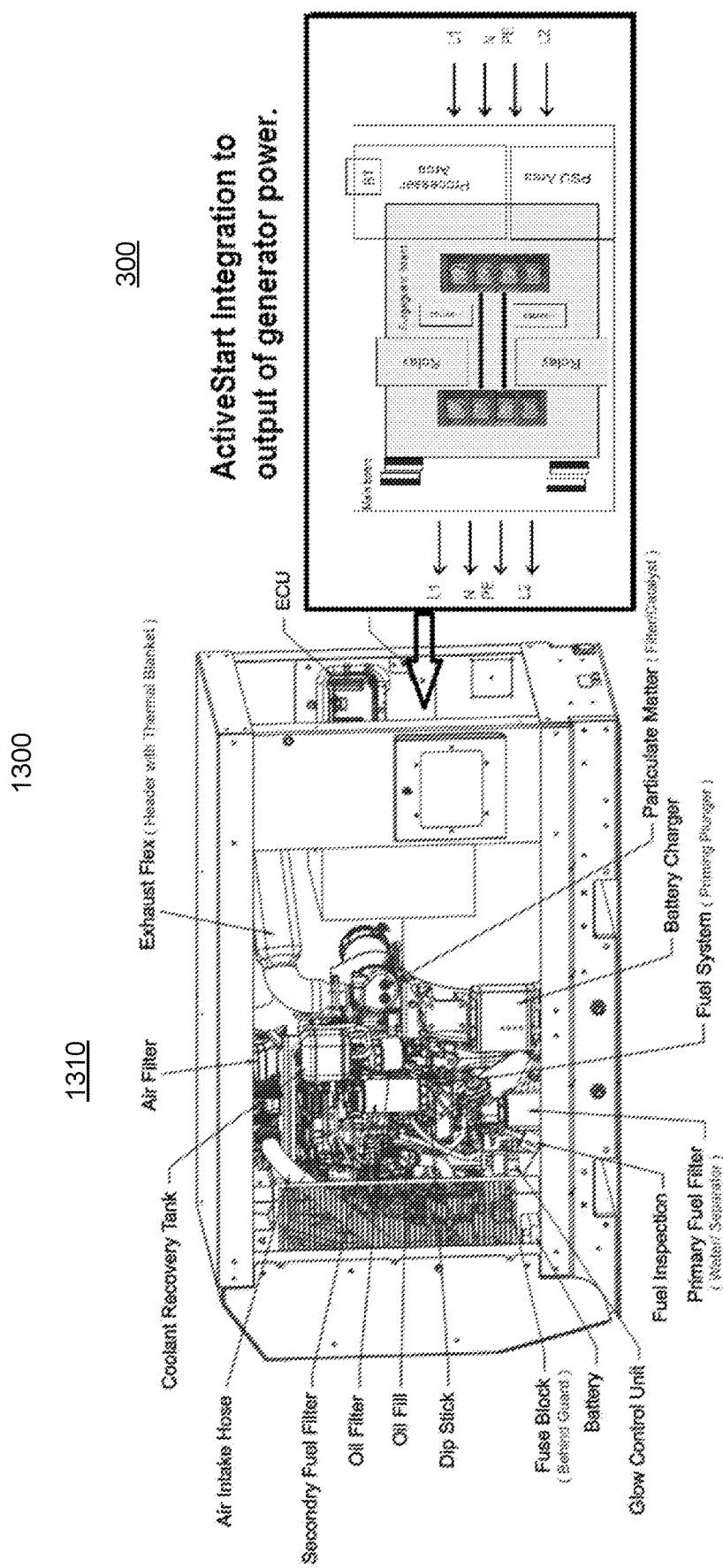
FIG. 13 illustrates an example application in which the ICA is utilized with a generator, according to one or more embodiments.

FIG. 13 illustrates an example application in which the ICA is utilized with a power generator, according to one or more embodiments. As illustrated, system 1300 includes a generator 1310, which is a source of alternating current (AC) power, and multi-board design ICA 300. In the example of system 1300, the ICA 300 is integrated into power output circuitry of the generator 1310.

A controller of the ICA 300 continuously evaluates load power consumption based on load characteristics of one or more loads electrically connected via the ICA 300 to the generator 1310. In response to detecting an inrush current condition, the controller uses a soft-starter to initiate one or more soft-start procedures that includes triggering a thyristor to provide duty-cycled power using duty cycled parameters associated with characteristics of a particular load.

Since many modifications, variations, and changes in detail can be made to the described embodiments of the invention, it is intended that all matters in the foregoing description and shown in the accompanying drawings be interpreted as illustrative and not in a limiting sense. Thus, the scope of the invention should be determined by the appended claims and their legal equivalents.

What is claimed is:

1. Is amended to recite: An apparatus for controlling inrush current, the apparatus comprising:
a first connector adapted to connect to an alternating current (AC) source for supplying AC source power to the apparatus, the first connector having multiple hot wire lines, wherein each hot wire line is connected to a different thyristor, which is connectable to a same load or to a separate load from another thyristor connected to another hot wire line;
a second connector adapted to connect to one or more loads and supply power to the one or more loads;
control circuitry connected between the first and second connectors and comprising multiple soft-start circuit modules and a surge protection circuit module for protecting the one or more loads from voltage and current surges, the control circuitry further comprising a controller that causes the apparatus, while connected to the AC source, to:
  determine whether an inrush current condition is detected for a particular load;
  in response to detecting the inrush current condition:
    determine whether a single load or multiple loads are connected to respective hot wire lines of the apparatus;
    initiate a soft-start procedure comprising triggering the thyristor to provide duty-cycled power using duty cycled parameters associated with characteristics of the particular load;
    selectively execute a corresponding one of: (i) multiple independent soft start procedures for different loads running on a first "hot wire" line (L1) and a second "hot wire" line (L2), respectively; and (ii) a single soft start procedure for a single load connected to at least one of the first and second hot wire lines; and
    provide, via the thyristor, duty-cycled power supplying a specified power level to the particular load, the specified power level corresponding to steady state operation of the particular load; and
    in response to the specified power level being supplied to the particular load, complete the soft-start procedure by connecting the AC source power to the particular load and disengaging the thyristor.

2. The apparatus of claim 1, wherein to determine whether an inrush current condition is detected, the controller causes the apparatus to:
measure current and voltage characteristics of one or more individual hot wire lines of the second connector to which the one or more loads are connected in order to receive the AC source power;
determine whether one or more of a threshold increase in instantaneous load current consumption level and a threshold decrease in an instantaneous voltage associated with the particular load has occurred; and
in response to determining that one or more of the threshold increase in instantaneous load current consumption level and the threshold decrease in an instantaneous voltage has occurred, determine that the inrush current condition exists, indicative of an inductive load being started.

3. The apparatus of claim 1, wherein:
the apparatus supplies power to a collective load comprising the particular load added to an already operating load, wherein the particular load comprises one or more operating devices or appliances; and
to perform continuous evaluation of load power consumption, the controller causes the apparatus to:
determine an amount of power utilized by the already operating load for steady state operation at a time of initiation of a start-up phase for the added load;
determine, based on pre-established load characteristics, a peak soft-start current required to soft-start the added load;
determine, using the peak soft-start current for the added load and the amount of power utilized by the already operating load, an amount of current required by the collective load during each cycle of a soft-start period to successfully execute a soft-start procedure using the soft-start circuit module; and
in response to initiating the soft-start procedure:
provide, via a first thyristor, duty-cycled power supplying a first power level to the already operating load, based on the amount of current utilized by the already operating load, the first power level capable of enabling steady state operation of the already operating load to be maintained; and
provide, via a second thyristor, duty-cycled power supplying a second power level to the added load, based on the amounts of current utilized by the already operating load and required by the collective load, respectively, the second power level corresponding to steady state operation of both the already operating load and the added load, wherein the second power level is the specified power level.

4. The apparatus of claim 3, wherein the controller causes the apparatus to:
perform pulse width modulation (PWM) to control the thyristor to supply an output voltage representing duty-cycled power; and
maintain, during the soft-start cycle, steady state operation of the added load using the second power level which is a predetermined amount of power less than a peak soft start power level.

5. The apparatus of claim 1, wherein:
the surge protection circuit module comprises one or more fuses, each having a specific current rating, and surge protection components which include voltage suppression components;
each of the fuses is connected to one or more voltage suppression components coupled to one or more of a Neutral line and a Ground line, respectively;
and the one or more voltage suppression components are rated to absorb a specified amount of energy.

6. The apparatus of claim 5, wherein the controller causes the apparatus to:
determine whether current flows through a fuse having a specific current rating;
in response to not detecting current flow through the fuse, identify one or more of surge voltage and surge currents resulting in a blown fuse as a cause of a detected lack of current flow through the fuse;
equate blown surge protection components as a likely result of the one or more of surge voltage and surge currents; and
provide an indication that at least one of a corresponding surge protection component and a circuit board should be replaced, based on equating that the detected lack of current flow is likely associated with a blown surge protection component.

7. The apparatus of claim 5, wherein:
the surge protection circuit module is removably connected (i) in parallel with the soft-start circuit module, and (ii) to power connector lines, which include the one or more hot wire lines; and
one or more specifically rated fuses of the surge protection circuit module are removably connected to the one or more hot wire lines.

8. The apparatus of claim 1, wherein to perform the soft-start procedure, the controller causes the apparatus to:
gradually increase power being supplied to the particular load from a first power level to a peak soft-start power level, utilizing a specified ramp rate derived from one or more power supply demand profiles of operating load components;
wherein the controller executes the soft start procedure within a control period selected relative to a start-up time of the particular load to enable sufficient reduction and mitigation of the inrush current condition.

9. The apparatus of claim 1, wherein the controller causes the apparatus to:
in response to use of the apparatus to power a single load connected to a single one of the first hot wire line and the second hot wire line, providing a steady state power of a first voltage level; and
in response to use of the apparatus to power two separate loads, each connected on one of the first and the second hot wire lines, respectively, channel a first voltage level to each of the first hot wire line and the second hot wire line to separately power respective first and second loads.

10. The apparatus of claim 9, wherein the controller further causes the apparatus to:
in response to use of the apparatus to power a single load requiring a larger voltage than a first voltage level available from a single one of the first hot wire line and the second hot wire line:
receive input power at the first voltage level on the first hot wire line;
receive input power at the first voltage level out-of-phase with a first phase on the second hot wire line; and
provide a combined voltage level of a multiple greater than 1 of the first voltage level to the single load.

11. A method for controlling inrush current, the method comprising:
supplying alternating current (AC) source power to an apparatus, wherein the apparatus comprises a first connector adapted to connect to an AC outlet having multiple hot wire lines to further connect each hot wire line to a different thyristor, which is connectable to a same load or to a separate load from another thyristor connected to another hot wire line, a second connector adapted to connect to one or more loads and supply power to the one or more loads, and control circuitry connected between the first and second connectors and comprising multiple soft-start circuit modules and a surge protection circuit module for protecting the one or more loads from voltage and current surges, the control circuitry further comprising a controller that processes programming and configuration instructions while the apparatus is connected to the AC source;
determining whether an inrush current condition is detected for a particular load;
in response to detecting the inrush current condition:
determining whether a single load or multiple loads are connected to respective hot wire lines of the apparatus;
initiating a soft-start procedure comprising triggering the thyristor to provide duty-cycled power using duty cycled parameters associated with characteristics of the particular load;
selectively executing a corresponding one of: (i) multiple independent soft start procedures for different loads running on a first "hot wire" line (L1) and a second "hot wire" line (L2), respectively; and (ii) a single soft start procedure for a single load connected to at least one of the first and second hot wire lines; and
providing, via the thyristor, duty-cycled power supplying a specified power level to the particular load, the specified power level corresponding to steady state operation of the particular load; and
in response to the specified power level being supplied to the particular load, completing the soft-start procedure by connecting the AC source power to the particular load and disengaging the thyristor.

12. The method of claim 11, wherein said determining further comprises:
measuring current and voltage characteristics of one or more individual hot wire lines of the second connector to which the one or more loads are connected in order to receive the AC source power;
determining whether one or more of a threshold increase in instantaneous load current consumption level and a threshold decrease in an instantaneous voltage associated with the particular load has occurred; and
in response to determining that one or more of the threshold increase in instantaneous load current consumption level and the threshold decrease in an instantaneous voltage has occurred, determining that the inrush current condition exists, indicative of an inductive load being started.

13. The method of claim 11, further comprising:
supplying power to a collective load comprising the particular load added to an already operating load, wherein the particular load is an added load comprising one or more operating devices or appliances;
wherein to perform continuous evaluation of load power consumption, the method further comprises:
determining an amount of power utilized by the already operating load at a time of an initiation of a start-up phase for the added load;
wherein the already operating load utilizes an identified power level to maintain steady state operation;
determining, based on pre-established load characteristics, a peak soft-start current required to soft-start the added load;
determining, using the peak soft-start current for the added load and the amount of power utilized by the already operating load, an amount of current required by the collective load during each cycle of a soft-start period to successfully execute a soft-start procedure using the soft-start circuit module; and
in response to initiating the soft-start procedure:
providing, via the thyristor, duty-cycled power supplying a first power level to the already operating load, based on the amount of current utilized by the already operating load, the first power level capable of enabling steady state operation of the already operating load to be maintained; and
providing, via the thyristor, duty-cycled power supplying a second power level to the added load, based on the amounts of current utilized by the already operating load and required by the collective load, respectively, the second power level corresponding to steady state operation of both the already operating load and the added load, wherein the second power level is the specified power level.

14. The method of claim 13, further comprising:
performing pulse width modulation (PWM) to control the thyristor to supply an output voltage representing duty-cycled power; and
maintaining, during the soft-start cycle, steady state operation of the added load using the second power level which is a predetermined amount of power less than a peak soft start power level.

15. The method of claim 11, wherein:
the surge protection circuit module comprises one or more fuses, each having a specific current rating, and surge protection components which include voltage suppression components;
each of the fuses is connected to one or more voltage suppression components coupled to one or more of a Neutral line and a Ground line, respectively;
the one or more voltage suppression components are rated to absorb a specified amount of energy; and
the method further comprises:
measuring a voltage across a fuse connected to a corresponding hot wire line in order to determine whether current flows through the fuse;
in response to not detecting current flow through the fuse, identifying one or more of surge voltage and surge currents resulting in a blown fuse as a likely cause of a detected lack of current flow through the fuse;
equating blown surge protection components as a likely result of the one or more of surge voltage and surge currents; and
providing an indication that at least one of a corresponding surge protection component and a circuit board should be replaced, based on identifying the detected lack of current flow.

16. The method of claim 11, wherein performing the soft-start procedure further comprises:

gradually increasing power being supplied to the particular load from a first power level to a peak soft-start power level, utilizing a specified ramp rate derived from one or more power supply demand profiles of various operating load components;

wherein the controller executes the soft-start procedure within a control period selected relative to a start-up time of the particular load to enable sufficient reduction and mitigation of the inrush current condition.

17. The method of claim 11, wherein executing one or more of: multiple independent soft start procedures for loads running on a first "hot wire" line (L1) and a second "hot wire" line (L2), respectively; and a single soft start procedure for a load connected to both the first and second hot wire lines further comprises:

in response to use of the apparatus to power a single load connected to a single one of the first hot wire line and the second hot wire line, providing a steady state power of a first voltage level; and in response to use of the apparatus to power two separate loads, each connected on one of the first and the second hot wire lines, respectively, channel a first voltage level to each of the first hot wire line and the second hot wire line to separately power respective first and second loads.

18. The method of claim 17, wherein in response to use of the apparatus to power a single load requiring a larger voltage than a first voltage level available from a single one of the first hot wire line and the second hot wire line:

receiving input power at the first voltage level on the first hot wire line;

receiving input power at the first voltage level out-of-phase with a first phase on the second hot wire line; and providing a combined voltage level of a multiple greater than 1 of the first voltage level to the single load.

\* \* \* \* \*